United States Patent
Xiong et al.

(10) Patent No.: US 11,764,762 B1
(45) Date of Patent: Sep. 19, 2023

(54) RING OSCILLATOR WITH STAGES IMPLEMENTED TO ASSESS PFET-NFET PROCESS PERFORMANCE

(71) Applicant: QUALCOMM Incorporated, San Diego, CA (US)

(72) Inventors: Haoyu Xiong, San Diego, CA (US); Min Chen, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/898,332

(22) Filed: Aug. 29, 2022

(51) Int. Cl.
- H03K 3/03 (2006.01)
- H03K 19/0944 (2006.01)
- H03K 3/354 (2006.01)

(52) U.S. Cl.
CPC ........... *H03K 3/0315* (2013.01); *H03K 3/354* (2013.01); *H03K 19/0944* (2013.01)

(58) Field of Classification Search
CPC .... H03K 3/0315; H03K 3/0322; H03K 3/354; H03K 5/133; H03K 5/134; H03K 19/0944; H03L 7/0995–0997
USPC .......................................................... 331/57
See application file for complete search history.

(56) References Cited

U.S. PATENT DOCUMENTS

| | | | | |
|---|---|---|---|---|
| 5,677,650 A | * | 10/1997 | Kwasniewski | H03K 3/354 331/177 R |
| 6,710,667 B2 | * | 3/2004 | Nagano | H03B 5/20 330/253 |
| 7,126,431 B2 | * | 10/2006 | Mintchev | H03H 11/265 327/246 |
| 2012/0038427 A1 | * | 2/2012 | Stoiber | H03K 3/0315 331/74 |
| 2018/0095115 A1 | * | 4/2018 | Fukuoka | G01R 19/16552 |
| 2019/0238122 A1 | * | 8/2019 | Wang | H03L 7/0995 |

* cited by examiner

*Primary Examiner* — Levi Gannon
(74) *Attorney, Agent, or Firm* — Loza & Loza, LLP

(57) ABSTRACT

An integrated circuit (IC) including a first ring oscillator (RO) including a first set of cascaded stages, wherein each of the first set of cascaded stages comprises a first logic inverter, including: a first set of field effect transistors (FETs) coupled in parallel between a first voltage rail and a first intermediate node, wherein the first set of FETs include a set of gates coupled to an input of the first logic inverter; and a second set of FETs coupled in series between the first intermediate node and a second voltage rail, wherein the second set of FETs includes at least a first FET including a gate coupled to the input of the first logic inverter, and at least a second FET that is diode-connected in accordance with a first mode of operation.

28 Claims, 11 Drawing Sheets

RING OSCILLATOR WITH STAGES IMPLEMENTED TO ASSESS PFET-NFET PROCESS PERFORMANCE

FIELD

Aspects of the present disclosure relate generally to assessment of process performance (e.g., skew) of p-channel field effect transistors (PFETs) and n-channel field effect transistors (NFETs) in integrated circuits (ICs) using ring oscillators (RO) implemented for such process assessment.

BACKGROUND

An integrated circuit (IC), such as a system on chip (SOC), may include many transistors. These transistors may be implemented as complementary metal oxide semiconductor (CMOS) field effect transistors (FETs), including n-channel FETs (NFETs) and p-channel FETs (PFETs). As ICs, such as SOCs, are often mass produced, there may be process variation affecting switching performance of NFETs and PFETs. The process variation affecting NFETs and PFETs may be assessed or measured based on their respective switching speeds. Process monitoring, modeling, and circuit compensation may follow from such assessment or measurement of the process variation of NFETs and PFETs.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an integrated circuit (IC). The IC includes a first ring oscillator (RO) comprising a first set of cascaded stages, wherein each of the first set of cascaded stages comprises a first logic inverter, comprising: a first set of field effect transistors (FETs) coupled in parallel between a first voltage rail and a first intermediate node, wherein the first set of FETs include a set of gates coupled to an input of the first logic inverter; and a second set of FETs coupled in series between the first intermediate node and a second voltage rail, wherein the second set of FETs includes at least a first FET including a gate coupled to the input of the first logic inverter, and at least a second FET that is diode-connected in accordance with a first mode of operation.

Another aspect of the disclosure relates to a logic inverter. The logic inverter includes a first set of field effect transistors (FETs) coupled in parallel between a first voltage rail and an output, wherein the first set of FETs include a set of gates coupled to an input, respectively; and a second set of FETs coupled in series between the output and a second voltage rail, wherein the second set of FETs includes at least a first FET including a gate coupled to the input, and at least a second FET that is diode-connected in accordance with a first mode of operation.

Another aspect of the disclosure relates to a wireless communication device. The wireless communication device includes at least one antenna; a transceiver coupled to the at least one antenna; one or more signal processing cores coupled to the transceiver; and a ring oscillator (RO) coupled to the one or more signal processing cores, wherein the RO comprises a set of cascaded stages, wherein each of the set of cascaded stages comprises a first logic inverter, including: a first set of field effect transistors (FETs) coupled in parallel between a first voltage rail and a first intermediate node, wherein the first set of FETs include a set of gates coupled to an input of the first logic inverter; and a second set of FETs coupled in series between the first intermediate node and a second voltage rail, wherein the second set of FETs includes at least a first FET including a gate coupled to the input of the first logic inverter, and at least a second FET that is diode-connected in accordance with a first mode of operation.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

Figure 1A:
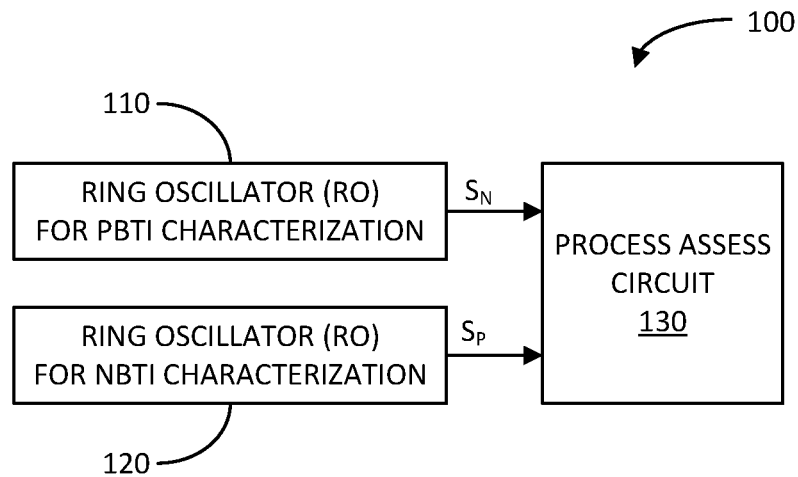
FIG. 1A illustrates a block diagram of an example process measuring apparatus for measuring process performance (e.g., skew) associated with n-channel field effect transistors (NFETs) and p-channel field effect transistors (PFETs) in an integrated circuit (IC in accordance with an aspect of the disclosure.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

An integrated circuit (IC), such as a system on chip (SOC), may include many transistors, such as in the billion range. Many of these transistors are complementary metal oxide semiconductor (CMOS) field effect transistors (FETs), including n-channel FETs (NFETs) (or sometimes referred to as n-channel metal oxide semiconductor (NMOS) FETs) and p-channel FETs (PFETs) (or sometimes referred to as p-channel metal oxide semiconductor (NMOS) FETs). As ICs, such as SOCs, are often mass produced, there may be process variation affecting NFETs and PFETs across different ICs and even across different locations on the same IC die. The process variation affecting NFETs and PFETs may be assessed or measured based on their respective switching speeds.

For example, compared to a mean or average switching speed for a significant sample size NFETs and PFETs, if both NFETs and PFETs of an IC have switching speeds lower than the mean switching speed, the corresponding NFETs and PFETs of the IC may be characterized as having a slow-slow (SS) process corner. If both NFETs and PFETs of an IC have switching speeds higher than the mean switching speed, the corresponding NFETs and PFETs of the IC may be characterized as having a fast-fast (FF) process corner. If NFETs of an IC have switching speeds higher than the mean switching speed, and PFETs of the IC have switching speeds lower than the mean switching speed, the corresponding NFETs and PFETs of the IC may be characterized as having a fast-slow (FS) process corner. And, if NFETs of an IC have switching speeds lower than the mean switching speed, and PFETs of the IC have switching speeds higher than the mean switching speed, the corresponding NFETs and PFETs of the IC may be characterized as having a slow-fast (SF) process corner.

There may be many reasons to measure process corners of ICs. For example, there may be a need to assess process variation across many ICs fabricated by an IC foundry to assess the quality control, as well as to formulate process models for the ICs. Second, there may a need to characterize process corner for an IC to tune and compensate the IC for process variation (e.g., increase clock frequency if an SS process corner is determined, decrease clock frequency if an FF process corner is determined, and perform duty cycle distortion (DCD) compensation if either an FS or SF process corner is determined). Third, there may be a need to characterize process corner for an IC over its operational lifetime to tune and compensate for process aging (e.g., process aging (e.g., threshold voltage $V_T$ increase) due to positive-bias temperature instability (PBTI) which affect NFETs, and negative-bias temperature instability (NBTI) which affects PFETs).

FIG. 1A illustrates a block diagram of an example process measuring apparatus 100 for measuring process performance (e.g., skew) of associated NFETs and PFETs in an integrated circuit (IC) in accordance with an aspect of the disclosure. The process measuring apparatus 100 includes a first ring oscillator (RO) 110, a second ring oscillator (RO) 120, and a process assessment circuit 130.

As discussed in more detail further herein, the first RO 110 may be implemented or configured to generate a periodic or oscillating signal $S_N$ whose frequency $f_N$ is more based on the process performance of the NFETs compared to the PFETs. In other words, the frequency $f_N$ of the signal $S_N$ may be more related or dependent on the PBTI or switching speed of the NFETs of the first RO 110 compared to the NBTI or switching speed of the PFETs of the first RO 110.

Similarly, the second RO 120 may be implemented or configured to generate a periodic or oscillating signal $S_P$ whose frequency $f_P$ is more based on the process performance of the PFETs compared to the NFETs. In other words, the frequency $f_P$ of the signal $S_P$ may be more related or dependent on the NBTI or switching speed of the PFETs of the second RO 120 compared to the PBTI or switching speed of the NFETs of the second RO 120.

The process assessment circuit 130 is configured to receive the signals $S_N$ and $S_P$, determine their respective frequencies $f_N$ and $f_P$, and perform some operation based on the frequencies $f_N$ and $f_P$. For example, the process assessment circuit 130 may output the frequency measurements for analysis by an IC foundry to assess consistency and quality of its IC processes, to improve their IC processes, and to model the process performance of the NFETs and PFETs of their ICs. Alternatively, or in addition to, the process assessment circuit 130 may tune or compensate various circuitry in the IC to address different process corners based on the frequencies $f_N$ and $f_P$.

For example, if the frequencies $f_N$ and $f_P$ indicate an SS or FF process corner, the process assessment circuit 130 may tune an associated clock generating circuit to increase or decrease the frequency of its clock signal. If the frequencies $f_N$ and f p indicate an FS or SF process corner, the process assessment circuit 130 may perform operation to lower duty cycle distortion (DCD) of a clock signal generated by a clock generating circuit. The process assessment circuit 130 may monitor the frequencies $f_N$ and $f_P$ at certain time intervals over the operational lifetime of the IC to compensate for aging effects on the NFETs and PFETs.

Figure 1B:
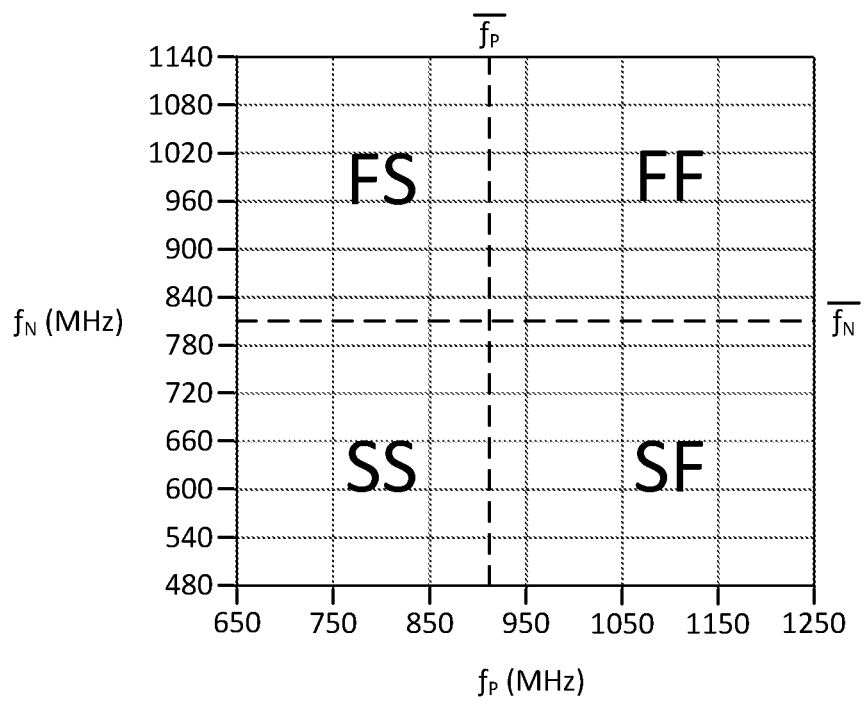
FIG. 1B illustrates a graph of a frequency $f_N$ of a signal $S_N$ generated by a ring oscillator (RO) for measuring NFET process performance versus a frequency $f_P$ of a signal $S_P$ generated by the second RO for measuring PFET process performance in accordance with another aspect of the disclosure.

FIG. 1B illustrates a graph of the frequency $f_N$ of the signal $S_N$ generated by the first RO 110 versus the frequency $f_P$ of the signal $S_P$ generated by the second RO 120 in accordance with another aspect of the disclosure. The y- or vertical-axis represents frequency $f_N$ of the signal $S_N$ ranging from 480 mega Hertz (MHz) to 1140 MHz. The x- or horizontal-axis represents frequency $f_P$ of the signal $S_P$ ranging from 650 MHz to 1250 MHz. A horizontal dashed line represents a first mean frequency $f_N$ of the signal $S_N$ (e.g., 810 MHz) for a significant sample size of ICs tested. A vertical dashed line represents a mean frequency $f_P$ of the signal $S_P$ (e.g., 910 MHz) for the significant sample size of ICs tested.

If, in this example, the process assessment circuit 130 determines that both the frequencies $f_N$ and $f_P$ are below the respective mean frequencies $f_N$ (e.g., 810 MHz) and $f_P$ (e.g., 910 MHz), the process assessment circuit 130 may classify the process corner for such IC or region thereof as being an SS process corner, and may take appropriate action accordingly. If, on the other hand, the process assessment circuit 130 determines that both the frequencies $f_N$ and $f_P$ are above the respective mean frequencies $f_N$ (e.g., 810 MHz) and $f_P$ (e.g., 910 MHz), the process assessment circuit 130 may classify the process corner for such IC or region thereof as being an FF process corner, and may take appropriate action accordingly.

If the process assessment circuit 130 determines that the frequency $f_N$ is above the mean frequency $f_N$ (e.g., 810 MHz) and the frequency $f_P$ is below the mean frequency $f_P$ (e.g., 910 MHz), the process assessment circuit 130 may classify the process corner for such IC or region thereof as being an FS process corner, and may take appropriate action accordingly. If the process assessment circuit 130 determines that the frequency $f_N$ is below the mean frequency $f_N$ (e.g., 810 MHz) and the frequency $f_P$ is above the mean frequency $f_P$ (e.g., 910 MHz), the process assessment circuit 130 may classify the process corner for such IC or region thereof as being an SF process corner, and may take appropriate action accordingly.

Figure 2A:
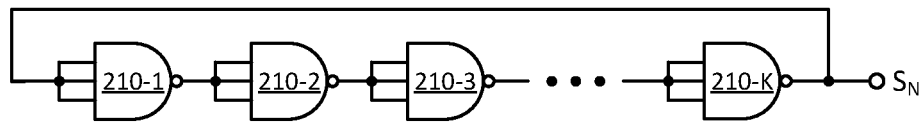
FIG. 2A illustrates a schematic diagram of an example ring oscillator (RO) implemented to assess n-channel field effect transistor (NFET) process performance in accordance with another aspect of the disclosure.

FIG. 2A illustrates a schematic diagram of an example ring oscillator (RO) 200 in accordance with another aspect of the disclosure. The RO 200 may be an example detailed implementation of the ring oscillator (RO) 110 previously discussed. The RO 200 includes a set of cascaded logic inverters 210-1 to 210-K arranged in a ring (where K is an odd integer). That is, the set of cascaded logic inverters 210-1 to 210-K include a set of outputs coupled to a set of inputs of cascaded logic inverters 210-2 to 210-K and 210-1, respectively.

Each of the set of cascaded logic inverters 210-1 to 210-K may be implemented as a three-input NAND gate with its three inputs coupled together. As discussed further herein, in this configuration, the RO 200 is configured to generate an oscillating or periodic signal $S_N$ whose frequency $f_N$ is based more on the process performance (e.g., switching speed or skew) of the NFETs of the cascaded logic inverters 210-1 to 210-K as compared to the PFETs of the cascaded logic inverters 210-1 to 210-K. As previously mentioned, the process assessment circuit 130 may be configured to receive and analyze the signal $S_N$ to produce a characterization of the process performance of the NFETs associated with the set of cascaded logic inverters 210-1 to 210-K.

Figure 2B:
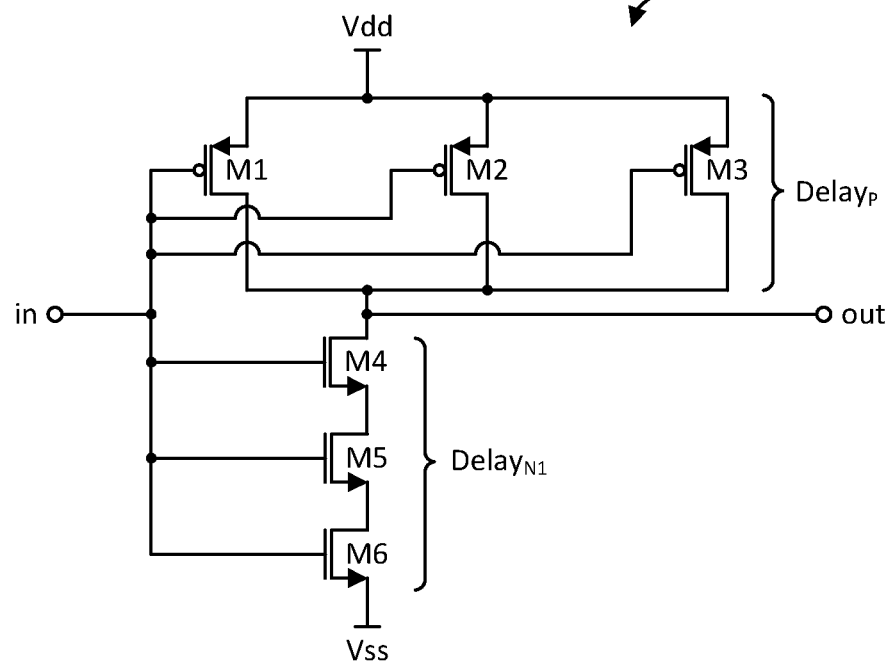
FIG. 2B illustrates a schematic diagram of an example logic inverter of the ring oscillator (RO) of FIG. 2A in accordance with another aspect of the disclosure.

FIG. 2B illustrates a schematic diagram of an example logic inverter 250 in accordance with another aspect of the disclosure. The logic inverter 250 may be an example detailed implementation of one of the set of cascaded logic inverters 210-1 to 210-K of RO 200.

In particular, the logic inverter 250 includes three (3) p-channel metal oxide semiconductor field effect transistors (PMOS FETs) M1, M2, and M3 coupled in parallel between an upper voltage rail Vdd and an output of the logic inverter 250. More specifically, the PMOS FETs M1, M2, and M3 include respective sources coupled to the upper voltage rail Vdd, respective gates coupled together and to an input of the logic inverter 250, and respective drains coupled together and to the output of the logic inverter 250.

The logic inverter 250 further includes three (3) n-channel metal oxide semiconductor field effect transistors (NMOS FETs) M4, M5, and M6 coupled in series between the output of the logic inverter 250 and a lower voltage rail Vss (e.g., ground). More specifically, the NMOS FET M4 includes a drain coupled to the output of the logic inverter 250, and a gate coupled to the input of the logic inverter 250. The NMOS FET M5 includes a drain coupled to a source of NMOS FET M4, and a gate coupled to the input of the logic inverter 250. The NMOS FET M6 includes a drain coupled to a source of NMOS FET M5, a gate coupled to the input of the logic inverter 250, and a source coupled to the lower voltage rail Vss.

In operation, if the input signal is at a logic zero (0) (e.g., at substantially Vss potential), the PMOS FETs M1, M2, and M3 are turned on, and the NMOS FETs M4, M5, and M6 are turned off. The turned-on PMOS FETs M1, M2, and M3 couple the upper voltage rail Vdd to the output of the logic inverter 250 causing the output to produce an output signal at a logic one (1) (e.g., at substantially Vdd potential). The turned-off NMOS FETs M4, M5, and M6 electrically isolate the output of the logic inverter 250 from the lower voltage rail Vss.

Similarly, if the input signal is at a logic one (1) (e.g., at substantially Vdd potential), the PMOS FETs M1, M2, and M3 are turned off, and the NMOS FETs M4, M5, and M6 are turned on. The turned-on NMOS FETs M4, M5, and M6 couple the output of the logic inverter 250 to the lower voltage rail Vss causing the output to produce an output signal at a logic zero (0) (e.g., at substantially Vss potential).

The turned-off PMOS FETs M1, M2, and M3 electrically isolate the output of the logic inverter 250 from the upper voltage rail Vdd.

The process performance or switching speed of the logic inverter 250 is based on a first delay ($Delay_P$) associated with the PMOS FETs M1, M2, and M3 turning on in response to the input signal transitioning to a logic zero (0), and causing the output to transition to a logic one (1); and a second delay ($Delay_{N1}$) associated with the NMOS FETs M4, M5, and M6 turning on in response to the input signal transitioning to a logic one (1)), and causing the output to transition to a logic zero (0). The frequency $f_N$ of the signal $S_N$ generated by the RO 200 may be related to $1/(K*(Delay_P+Delay_{N1}))$, where K is the number of stages of the RO 200.

The $Delay_P$ is inversely related to the sum of the currents flowing through the parallel PMOS FETs M1, M2, and M3. Whereas, the $Delay_{N1}$ is inversely related to the current flowing through the series NMOS FETs M4, M5, and M6. As the effective turn-on resistance between the upper voltage rail Vdd and the output is the parallel resistance of three (3) turned-on PMOS FETs M1, M2, and M3, and the effective turn-on resistance between the output and the lower voltage rail Vss is the series resistance of three (3) turned-on NMOS FETs M4, M5, and M6, the sum of the currents flowing through the parallel PMOS FETs M1, M2, and M3 is significantly greater than the current flowing through the series NMOS FETs M4, M5, and M6. Accordingly, the $Delay_{N1}$ is significantly greater than the $Delay_P$. The frequency $f_N$ of the signal $S_N$ is then more dominated or based on the $Delay_{N1}$ compared to the $Delay_P$.

In theory, as the RO 200 is configured to generate a signal $S_N$ whose frequency $f_N$ is a measurement of the process performance (e.g., skew) of the NMOS FETs M4, M5, and M6, it is desired that the frequency $f_N$ be a function of only the $Delay_{N1}$. However, as discussed above, the frequency $f_N$ is a function of both $Delay_N$ and $Delay_P$. By making $Delay_{N1}$ much greater than $Delay_P$ ($Delay_{N1} \gg Delay_P$), the frequency $f_N$ approaches its ideal frequency of being only a function of $Delay_{N1}$.

Figure 3A:
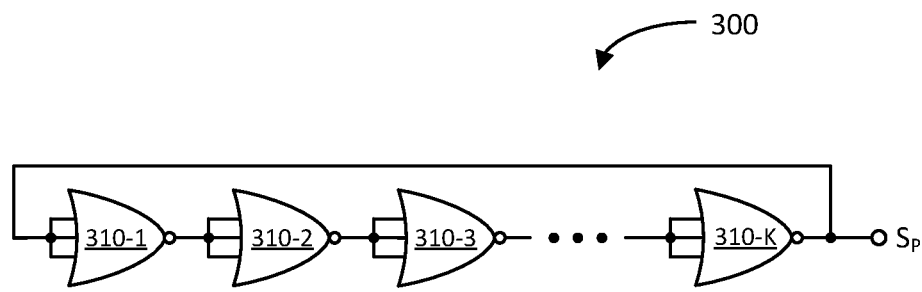
FIG. 3A illustrates a schematic diagram of an example ring oscillator (RO) implemented to assess p-channel field effect transistor (PFET) process performance in accordance with another aspect of the disclosure.

FIG. 3A illustrates a schematic diagram of an example ring oscillator (RO) 300 in accordance with another aspect of the disclosure. The RO 300 may be an example detailed implementation of the ring oscillator (RO) 120 previously discussed. The RO 300 includes a set of cascaded logic inverters 310-1 to 310-K arranged in a ring (where K is an odd integer). That is, the set of cascaded logic inverters 310-1 to 310-K include a set of outputs coupled to a set of inputs of cascaded logic inverters 310-2 to 310-K and 310-1, respectively.

Each of the set of cascaded logic inverters 310-1 to 310-K may be implemented as a three-input NOR gate with its three inputs coupled together. As discussed further herein, in this configuration, the RO 300 is configured to generate an oscillating or periodic signal $S_P$ whose frequency $f_P$ is based more on the process performance (e.g., switching speed or skew) of the PFETs of the cascaded logic inverters 310-1 to 310-K as compared to the NFETs of the cascaded logic inverters 310-1 to 310-K. As previously mentioned, the process assessment circuit 130 may be configured to receive and analyze the signal $S_P$ to produce a characterization of the process performance of the PFETs associated with the set of cascaded logic inverters 310-1 to 310-K.

Figure 3B:
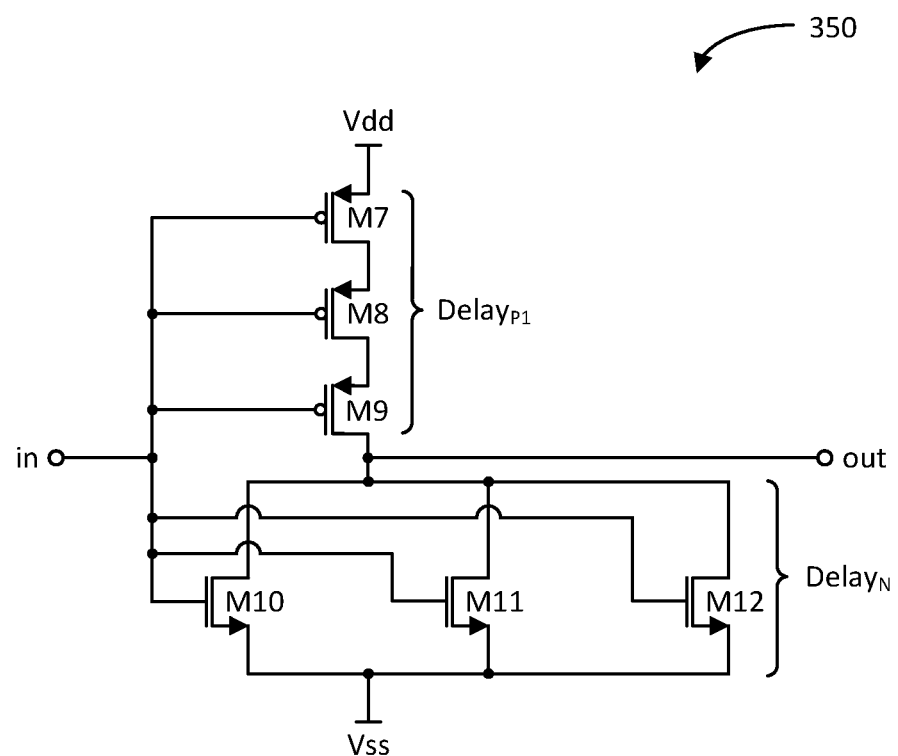
FIG. 3B illustrates a schematic diagram of an example logic inverter stage of the ring oscillator (RO) of FIG. 3A in accordance with another aspect of the disclosure.

FIG. 3B illustrates a schematic diagram of an example logic inverter 350 in accordance with another aspect of the disclosure. The logic inverter 350 may be an example detailed implementation of one of the set of cascaded logic inverters 310-1 to 310-K of RO 300.

In particular, the logic inverter 350 includes three (3) PMOS FETs M7, M8, and M9 coupled in series between an upper voltage rail Vdd and an output of the logic inverter 350. More specifically, the PMOS FET M7 includes a source coupled to the upper voltage rail Vdd, and a gate coupled to the input of the logic inverter 350. The PMOS FET M8 includes a source coupled to a drain of PMOS FET M7, and a gate coupled to the input of the logic inverter 350. The PMOS FET M9 includes a source coupled to a drain of PMOS FET M8, a gate coupled to the input of the logic inverter 350, and a drain coupled to the output of the logic inverter 350.

The logic inverter 350 further includes three (3) NMOS FETs M10, M11, and M12 coupled in parallel between the output of the logic inverter 350 and a lower voltage rail Vss (e.g., ground). More specifically, the NMOS FETs M10, M11, and M12 include respective drains coupled to the output of the logic inverter 350, respective gates coupled together and to the input of the logic inverter 350, and respective sources coupled to the lower voltage rail Vss.

In operation, if the input signal is at a logic zero (0) (e.g., at substantially Vss potential), the PMOS FETs M7, M8, and M9 are turned on, and the NMOS FETs M10, M11, and M12 are turned off. The turned-on PMOS FETs M7, M8, and M9 couple the upper voltage rail Vdd to the output of the logic inverter 350 causing the output to produce an output signal at a logic one (1) (e.g., at substantially Vdd potential). The turned-off NMOS FETs M10, M11, and M12 electrically isolate the output of the logic inverter 350 from the lower voltage rail Vss.

Similarly, if the input signal is at a logic one (1) (e.g., at substantially Vdd potential), the PMOS FETs M7, M8, and M9 are turned off, and the NMOS FETs M10, M11, and M12 are turned on. The turned-on NMOS FETs M10, M11, and M12 couple the output of the logic inverter 350 to the lower voltage rail Vss causing the output to produce an output signal at a logic zero (0) (e.g., at substantially Vss potential). The turned-off PMOS FETs M7, M8, and M9 electrically isolate the output of the logic inverter 350 from the upper voltage rail Vdd.

The process performance or switching speed of the logic inverter 350 is based on a first delay ($Delay_{P1}$) associated with the PMOS FETs M7, M8, and M9 turning on in response to the input signal transitioning to a logic zero (0), and causing the output to transition to a logic one (1); and a second delay ($Delay_N$) associated with the NMOS FETs M10, M11, and M12 turning on in response to the input signal transitioning to a logic one (1)), and causing the output to transition to a logic zero (0). The frequency $f_P$ of the signal $S_P$ generated by the RO 300 may be related to $1/(K*(Delay_{P1}+Delay_N))$, where K is the number of stages of the RO 300.

The $Delay_{P1}$ is inversely related to current flowing through the series PMOS FETs M7, M8, and M9. Whereas, the $Delay_N$ is inversely related to the sum of the currents flowing through the parallel NMOS FETs M10, M11, and M12. As the effective turn-on resistance between the upper voltage rail Vdd and the output is the series resistance of three (3) turned-on PMOS FETs M7, M8, and M9, and the effective turn-on resistance between the output and the lower voltage rail Vss is the parallel resistance of three (3) turned-on NMOS FETs M10, M11, and M12, the sum of the currents flowing through the parallel NMOS FETs M10, M11, and M12 is significantly greater than the current flowing through the series PMOS FETs M7, M8, and M9.

Accordingly, the $Delay_P$, is significantly greater than the $Delay_N$. The frequency $f_P$ of the signal $S_P$ is then more dominated or based on the $Delay_{P1}$ compared to the $Delay_N$.

Similarly, as discussed, as the RO 300 is configured to generate a signal $S_P$ whose frequency $f_P$ is a measurement of the process performance (e.g., skew) of the PMOS FETs M7, M8, and M9, it is desired that the frequency $f_P$ be a function of only the $Delay_{P1}$. However, as discussed above, the frequency $f_P$ is a function of both $Delay_{P1}$ and $Delay_N$. By making $Delay_{P1}$ much greater than $Delay_N$ ($Delay_{P1} \gg Delay_N$), the frequency $f_P$ approaches its ideal frequency of being only a function of $Delay_{P1}$.

Figure 4:
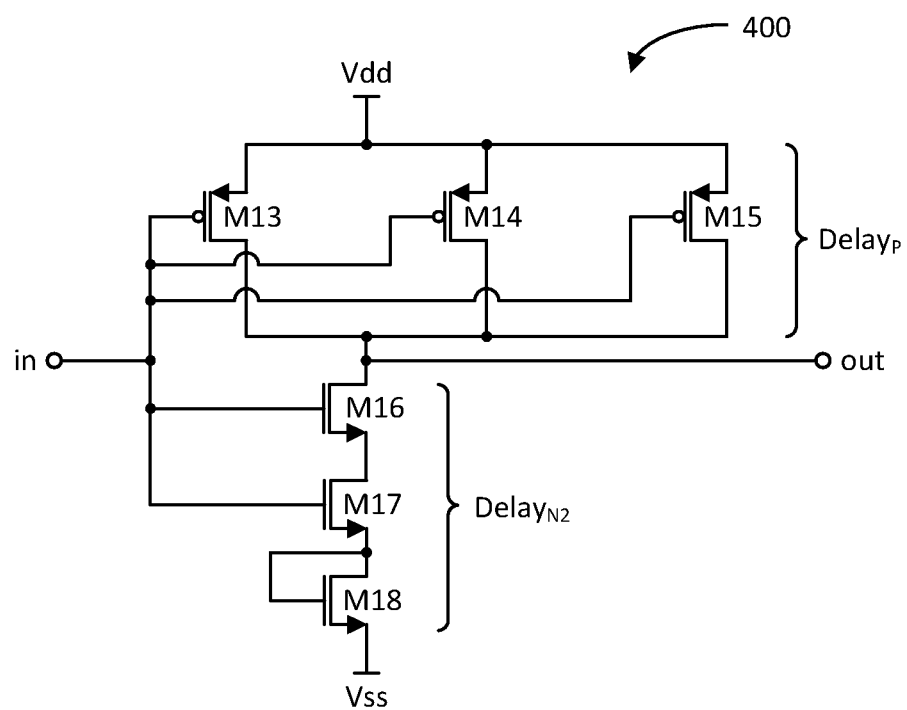
FIG. 4 illustrates a schematic diagram of an example logic inverter of a ring oscillator (RO) implemented to assess n-channel field effect transistor (NFET) process performance in accordance with another aspect of the disclosure.

FIG. 4 illustrates a schematic diagram of an example logic inverter 400 in accordance with another aspect of the disclosure. As discussed further herein, the logic inverter 400 may be implemented in a ring oscillator (RO) used to generate a signal $S_N$ to measure or assess the process performance (e.g., skew) of NMOS FETs in an integrated circuit (IC) incorporating the RO or NMOS FETs in the IC or at a location thereof near the RO.

In particular, the logic inverter 400 includes a set of PMOS FETs M13, M14, and M15 (e.g., three (3), but could be two (2), or four (4) or more) coupled in parallel between an upper voltage rail Vdd and an output of the logic inverter 400. More specifically, the PMOS FETs M13, M14, and M15 include respective sources coupled to the upper voltage rail Vdd, respective gates coupled to an input of the logic inverter 400, and respective drains coupled to the output of the logic inverter 400.

The logic inverter 400 further includes a set of NMOS FETs M16, M17, and M18 (e.g., three (3), but could be two (2), or four (4) or more) coupled in series between the output of the logic inverter 400 and a lower voltage rail Vss (e.g., ground). More specifically, the NMOS FET M16 includes a drain coupled to the output of the logic inverter 400, and a gate coupled to the input of the logic inverter 400. The NMOS FET M17 includes a drain coupled to a source of NMOS FET M16, and a gate coupled to the input of the logic inverter 400. In this implementation, the NMOS FET M18 is diode-connected, including drain and gate coupled to a source of NMOS FET M17, and a source coupled to the lower voltage rail Vss. It shall be understood that the series path between the output of the logic inverter 400 and the lower voltage rail Vss may include more than one diode-connected NMOS FET.

In operation, if the input signal is at a logic zero (0) (e.g., at substantially Vss potential), the PMOS FETs M13, M14, and M15 are turned on, and the NMOS FETs M16 and M17 are turned off, including the diode-connected NMOS FET M18 as there is no drain current through the device M18. The turned-on PMOS FETs M13, M14, and M15 couple the upper voltage rail Vdd to the output of the logic inverter 400 causing the output to produce an output signal at a logic one (1) (e.g., at substantially Vdd potential). The turned-off NMOS FETs M16, M17, and M18 electrically isolate the output of the logic inverter 400 from the lower voltage rail Vss.

Similarly, if the input signal is at a logic one (1) (e.g., at substantially Vdd potential), the PMOS FETs M13, M14, and M15 are turned off, and the NMOS FETs M16 and M17 are turned on, including the diode-connected NMOS FET M18 as there is a drain current through the device M18. The turned-on NMOS FETs M16, M17, and M18 couple the output of the logic inverter 400 to the lower voltage rail Vss causing the output to produce an output signal at a logic zero (0). However, due to the diode-connected NMOS FET M18, there is a threshold voltage $V_T$ drop across the device M18; thus, the output of the logic inverter 400 is at substantially $V_T+Vss$ potential. The turned-off PMOS FETs M13, M14, and M15 electrically isolate the output of the logic inverter 400 from the upper voltage rail Vdd.

The process performance or switching speed of the logic inverter 400 is based on a first delay ($Delay_P$) associated with the PMOS FETs M13, M14, and M15 turning on in response to the input signal transitioning to a logic zero (0), and causing the output to transition to a logic one (1); and a second delay ($Delay_{N2}$) associated with the NMOS FETs M16 and M17 and diode-connected NMOS FET M18 turning on in response to the input signal transitioning to a logic one (1)), and causing the output to transition to a logic zero (0). The frequency $f_N$ of the signal $S_N$ generated by a ring oscillator (RO) incorporating the logic inverter 400 may be related to $1/(K*(Delay_P+Delay_{N2})$, where K is the number of stages in the RO.

Compared to the logic inverter 250 previously discussed, due to the diode-connected NMOS FET M18, the turn-on resistance of the series path (M16→M17→M18) is increased compared to the turn-on resistance of the series path (M4→M5→M6) of logic inverter 250. Accordingly, the current through the series path is reduced; thereby, increasing the delay to $Delay_{N2}$. Thus, assuming the same technology node and device size, $Delay_{N2}$ associated with logic inverter 400 is significantly greater than $Delay_{N1}$ associated with logic inverter 250.

The $Delay_P$ is inversely related to the sum of the currents flowing through the parallel PMOS FETs M13, M14, and M15. Whereas, the $Delay_{N2}$ is inversely related to the current flowing through the series NMOS FETs M16 and M17, and diode-connected NMOS FET M18. As the effective turn-on resistance between the upper voltage rail Vdd and the output is the parallel resistance of three (3) turned-on PMOS FETs M13, M14, and M15, and the effective turn-on resistance between the output and the lower voltage rail Vss is the series resistance of three (3) turned-on NMOS FETs M16 and M17 and diode-connected M18, the sum of the currents flowing through the parallel PMOS FETs M13, M14, and M15 is significantly greater than the current flowing through the series NMOS FETs M16, M17, and M18.

Accordingly, the difference between $Delay_{N2}$ and $Delay_P$ has been significantly increased compared to the difference between $Delay_{N1}$ and $Delay_P$ of logic inverter 250, due to the diode-connected NMOS FET M18. Thus, the frequency $f_N$ of the signal $S_N$ is even more dominated or based on the $Delay_{N2}$ compared to the $Delay_P$. In theory, as an RO incorporating logic inverters 400 is configured to generate a signal $S_N$ whose frequency $f_N$ is a measurement of the process performance (e.g., skew) of the NMOS FETs M16, M17, and M18, it is desired that the frequency $f_N$ be a function of only the $Delay_{N2}$. As $Delay_{N2}$ is greater than $Delay_{N1}$ of logic inverter 250, the frequency $f_N$ of a signal $S_N$ generated by an RO incorporating logic inverters 400 provides a better measurement or assessment of the process performance of the NMOS FETs M16, M17, and M18 than the RO 200 with logic inverters 250.

Figure 5:
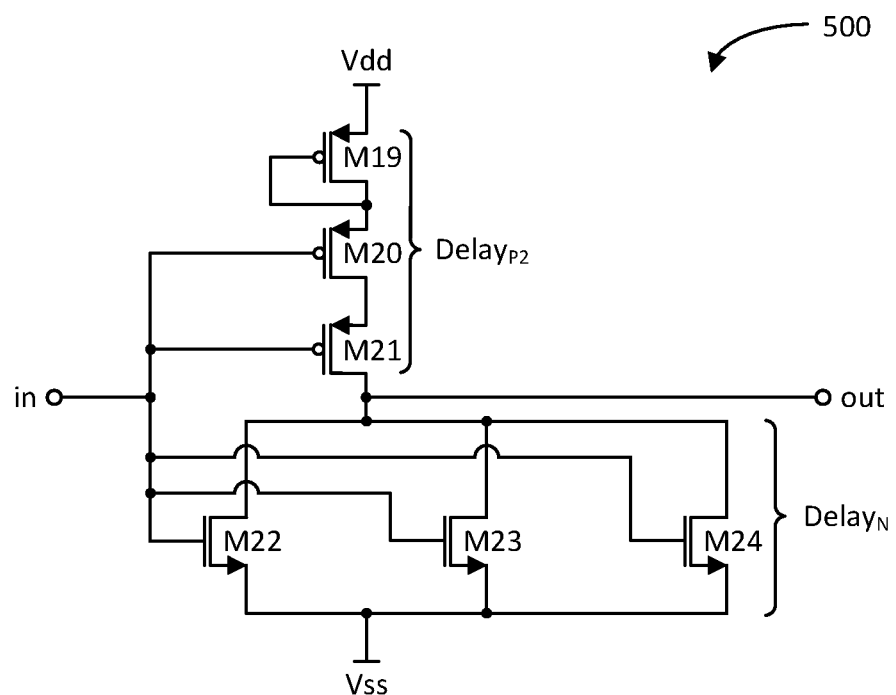
FIG. 5 illustrates a schematic diagram of an example logic inverter of a ring oscillator (RO) implemented to assess p-channel field effect transistor (PFET) process performance in accordance with another aspect of the disclosure.

FIG. 5 illustrates a schematic diagram of an example logic inverter 500 in accordance with another aspect of the disclosure. As discussed further herein, the logic inverter 500 may be implemented in a ring oscillator (RO) used to generate a signal $S_P$ to measure or assess the process performance (e.g., skew) of PMOS FETs in an integrated circuit (IC) incorporating the RO or PMOS FETs in the IC or at a location thereof near the RO.

In particular, the logic inverter 500 includes a set of PMOS FETs M19, M20, and M21 (e.g., three (3), but could be two (2), or four (4) or more) coupled in series between an upper voltage rail Vdd and an output of the logic inverter 500. In this implementation, the PMOS FET M19 is diode-connected, including a source coupled to the upper voltage rail Vdd, and a gate coupled to its drain. It shall be understood that the series path between the upper voltage rail Vdd and the output of the logic inverter 500 may include more than one diode-connected PMOS FET. The PMOS FET M20 includes a source coupled to the gate/drain of diode-connected PMOS FET M19, and a gate coupled to the input of the logic inverter 500. The PMOS FET M21 includes a source coupled to a drain of PMOS FET M20, a gate coupled to the input of the logic inverter 500, and a drain coupled to the output of the logic inverter 500.

The logic inverter 500 further includes a set of NMOS FETs M22, M23, and M24 (e.g., three (3), but could be two (2), or four (4) or more) coupled in parallel between the output of the logic inverter 500 and a lower voltage rail Vss (e.g., ground). More specifically, the NMOS FETs M22, M23, and M24 include respective drains coupled to the output of the logic inverter 500, respective gates coupled to the input of the logic inverter 500, and respective sources coupled to the lower voltage rail Vss.

In operation, if the input signal is at a logic zero (0) (e.g., at substantially Vss potential), the diode-connected PMOS FET M19 and the other PMOS FETs M20 and M21 turn on, and the NMOS FETs M22, M23, and M24 turn off. The turned-on PMOS FETs M19, M20, and M21 couple the upper voltage rail Vdd to the output of the logic inverter 500 causing the output to produce an output signal at a logic one (1). However, due to the diode-connected PMOS FET M19, there is a threshold voltage $V_T$ drop across the device M19; thus, the output of the logic inverter 500 is at substantially Vdd-$V_T$ potential. The turned-off NMOS FETs M22, M23, and M24 electrically isolate the output of the logic inverter 500 from the lower voltage rail Vss.

Similarly, if the input signal is at a logic one (1) (e.g., at substantially Vdd potential), the diode-connected PMOS FET M19 and the other PMOS FETs M20 and M21 turn off, and the NMOS FETs M22, M23, and M24 turn on. The turned-on NMOS FETs M22, M23, and M24 couple the output of the logic inverter 500 to the lower voltage rail Vss causing the output to produce an output signal at a logic zero (0) (e.g., at substantially Vss potential). The turned-off PMOS FETs M19, M20, and M21 electrically isolate the output of the logic inverter 500 from the upper voltage rail Vdd.

The process performance or switching speed of the logic inverter 500 is based on a first delay ($Delay_{P2}$) associated with the PMOS FETs M19, M20, and M21 turning on in response to the input signal transitioning to a logic zero (0), and causing the output to transition to a logic one (1); and a second delay ($Delay_N$) associated with the NMOS FETs M22, M23, and M24 turning on in response to the input signal transitioning to a logic one (1), and causing the output to transition to a logic zero (0). The frequency $f_P$ of the signal $S_P$ generated by an RO incorporating the logic inverter 500 may be related to $1/(K*(Delay_{P2}+Delay_N))$, where K is the number of stages of the RO.

Compared to the logic inverter 350 previously discussed, due to the diode-connected PMOS FET M19, the turn-on resistance of the series path (M19→M20→M21) is increased compared to the turn-on resistance of the series path (M7→M8→M9) of logic inverter 350. Accordingly, the current through the series path is decreased; thereby, increas-ing the delay to $Delay_{P2}$. Thus, assuming the same technology node and device size, $Delay_{P2}$ associated with logic inverter 500 is significantly greater than $Delay_{P1}$ associated with logic inverter 350.

The $Delay_{P1}$ is inversely related to current flowing through the series diode-connected PMOS FET M19 and PMOS FETs M20, and M21. Whereas, the $Delay_N$ is inversely related to the sum of the currents flowing through the parallel NMOS FETs M22, M23, and M24. As the effective turn-on resistance between the upper voltage rail Vdd and the output is the series resistance of three (3) turned-on PMOS FETs M19, M20, and M21, and the effective turn-on resistance between the output and the lower voltage rail Vss is the parallel resistance of three (3) turned-on NMOS FETs M22, M23, and M24, the sum of the currents flowing through parallel NMOS FETs M22, M23, and M24 is significantly greater than the current flowing through the series PMOS FETs M19, M20, and M21.

Accordingly, the difference between $Delay_{P2}$ and $Delay_N$ has been significantly increased compared to the difference between $Delay_{P1}$ and $Delay_N$ of logic inverter 350, due to the diode-connected PMOS FET M19. Thus, the frequency $f_P$ of the signal $S_P$ is even more dominated or based on the $Delay_{P2}$ compared to the $Delay_N$. In theory, as an RO incorporating logic inverters 500 is configured to generate a signal $S_P$ whose frequency $f_P$ is a measurement of the process performance (e.g., skew) of the PMOS FETs M19, M20, and M21, it is desired that the frequency $f_P$ be a function of only the $Delay_{P2}$. As $Delay_{P2}$ is greater than $Delay_{P1}$ of logic inverter 350, the frequency $f_P$ of a signal $S_P$ generated by an RO incorporating logic inverters 500 provides a better measurement or assessment of the process performance of the PMOS FETs M19, M20, and M21 than the RO 300 with logic inverters 350.

Figure 6:
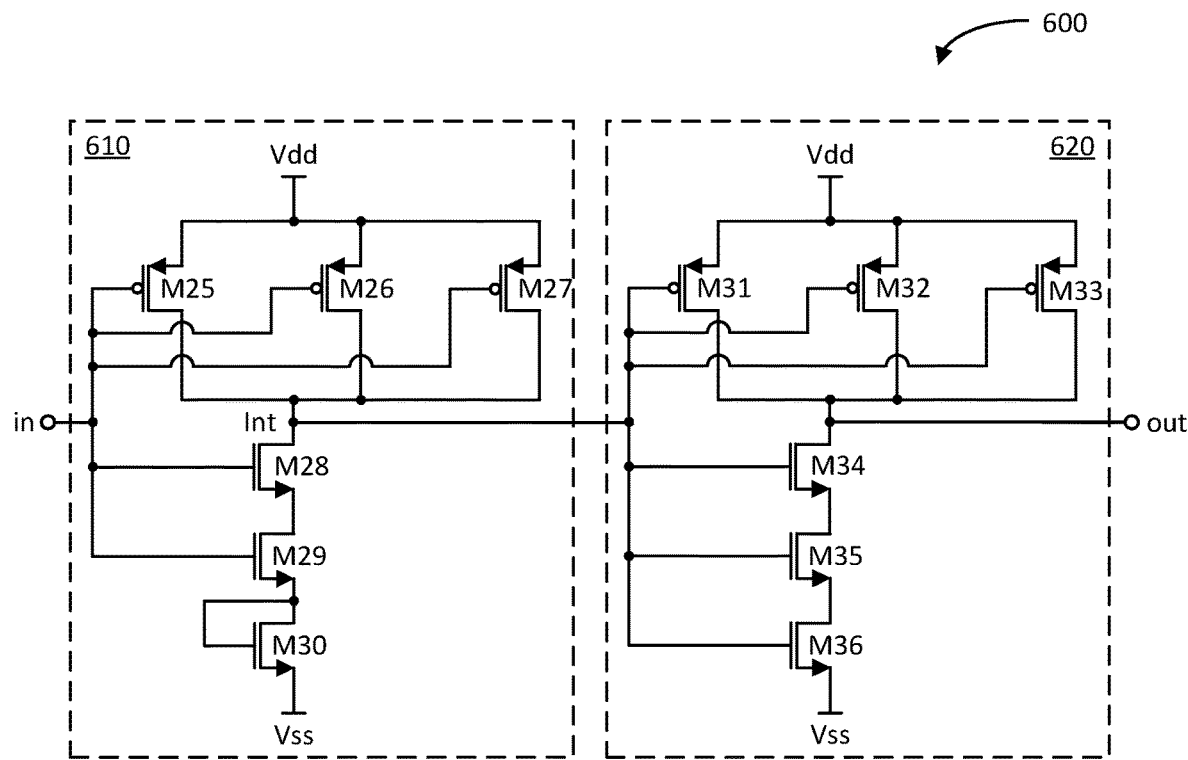
FIG. 6 illustrates a schematic diagram of an example stage of a ring oscillator (RO) implemented to assess n-channel field effect transistors (NFET) process performance in accordance with another aspect of the disclosure.

FIG. 6 illustrates a schematic diagram of an example two-logic inverter stage 600 of a ring oscillator (RO) in accordance with another aspect of the disclosure. As discussed further herein, the two-logic inverter stage 600 may be used in an RO for measuring or assessing process performance of NFETs. In particular, the two-logic inverter stage 600 includes a first logic inverter 610 followed by a second logic inverter 620.

The first logic inverter 610 may be implemented per logic inverter 400 previously discussed in detail. That is, the first logic inverter 610 includes a set of PMOS FETs M25, M26, and M27 (e.g., three (3), but could be two (2), or four (4) or more) coupled in parallel between an upper voltage rail Vdd and an intermediate node (int). The intermediate node may be the output of the first logic inverter 610. The set of parallel PMOS FETs M25, M26, and M27 include respective sources coupled to the upper voltage rail Vdd, respective gates coupled to an input of the two-logic inverter stage 600, and drains coupled to the intermediate node.

The first logic inverter 610 includes a set of NMOS FETs M28, M29, and M30 (e.g., three (3), but could be two (2), or four (4) or more) coupled in series between the intermediate node and a lower voltage rail Vss (e.g., ground). The NMOS FET M30 may be diode-connected. It shall be understood that the series path between the intermediate node and the lower voltage rail Vss may include more than one diode-connected NMOS FET. More specifically, the NMOS FET M28 includes a drain coupled to the intermediate node, and a gate coupled to the input of the two-logic inverter stage 600. The NMOS FET M29 includes a drain coupled to a source of NMOS FET M28, and a gate coupled to the input of the two-logic inverter stage 600. The diode-connected NMOS FET M30 includes drain and gate coupled together, and to a source of NMOS FET M29, and a source coupled to the lower voltage rail Vss.

The second logic inverter 620 may be implemented per logic inverter 250 previously discussed in detail. In particular, the second logic inverter 620 includes a set of PMOS FETs M31, M32, and M33 (e.g., three (3), but could be two (2), or four (4) or more) coupled in parallel between the upper voltage rail Vdd and an output of the two-logic inverter stage 600. The set of PMOS FETs M31, M32, and M33 include respective sources coupled to the upper voltage rail Vdd, respective gates coupled to the intermediate node, and drains coupled to the output.

The second logic inverter 620 further includes a set of NMOS FETs M34, M35, and M36 (e.g., three (3), but could be two (2), or four (4) or more) coupled in series between the output and the lower voltage rail Vss. More specifically, the NMOS FET M34 includes a drain coupled to the output, and a gate coupled to the intermediate node. The NMOS FET M35 includes a drain coupled to a source of NMOS FET M34, and a gate coupled to the intermediate node. The NMOS FET M36 includes a drain coupled to a source of NMOS FET M35, a gate coupled to the intermediate node, and a source coupled to the lower voltage rail Vss.

As previously discussed with regard to logic inverter 400, the voltage swing at the intermediate node of the first logic inverter 610 is not full rail-to-rail swing (e.g., between Vdd and Vss potentials). Instead, the voltage swing at the intermediate node is substantially between Vdd and $V_T$+Vss potentials, where $V_T$ is the threshold voltage of the diode-connected NMOS FET M30. If the first logic inverter 610 were to be cascaded with other similarly-configured logic inverters in a ring oscillator (RO), the non-rail-to-rail swing of the logic inverters may not be sufficient to cause the RO to oscillate. Thus, the second logic inverter 620 (without the diode-connected NMOS FET) is able to generate rail-to-rail voltage swing at the output; and thus, the two-logic inverter stage 600 is able to be cascaded to form an RO capable of generating and sustaining an oscillating or periodic signal.

Figure 7:
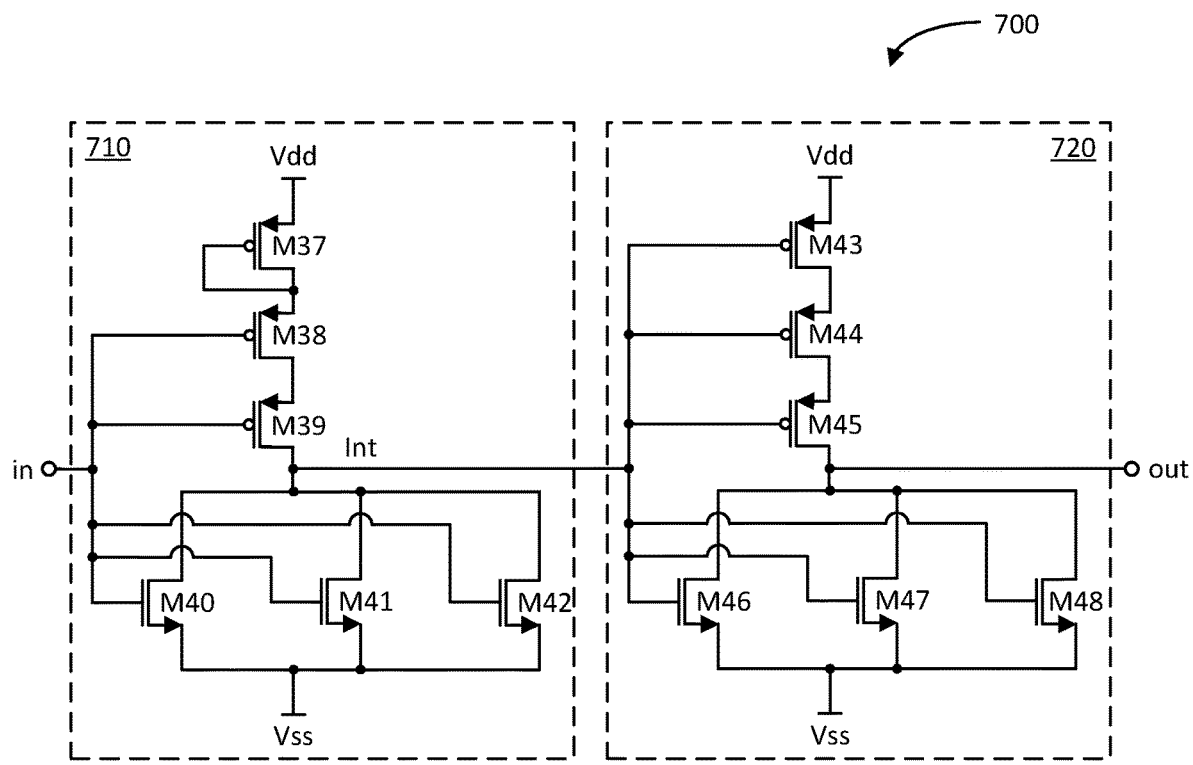
FIG. 7 illustrates a schematic diagram of an example stage of a ring oscillator (RO) implemented to assess p-channel field effect transistor (PFET) process performance in accordance with another aspect of the disclosure.

FIG. 7 illustrates a schematic diagram of another example two-logic inverter stage 700 of a ring oscillator (RO) in accordance with another aspect of the disclosure. As discussed further herein, the two-logic inverter stage 700 may be used in an RO for measuring or assessing process performance (e.g., skew) of PFETs. In particular, the two-logic inverter stage 700 includes a first logic inverter 710 followed by a second logic inverter 720.

The first logic inverter 710 may be implemented per logic inverter 500 previously discussed in detail. That is, the first logic inverter 710 includes a set of PMOS FETs M37, M38, and M39 (e.g., three (3), but could be two (2), or four (4) or more) coupled in series between an upper voltage rail Vdd and an intermediate node (int). The intermediate node may be the output of the first logic inverter 710. The PMOS FET M37 may be diode-connected. It shall be understood that the series path between the upper voltage rail Vdd and the intermediate node may include more than one diode-connected PMOS FET. More specifically, the diode-connected PMOS FET M37 includes a source coupled to the upper voltage rail Vdd, and gate and drain coupled together. The PMOS FET M38 includes a source coupled to the gate/drain of diode-connected PMOS FET M37, and a gate coupled to an input of the two-logic inverter stage 700. The PMOS FET M39 includes a source coupled to a drain the PMOS FET M38, a gate coupled to the input of the two-logic inverter stage 700, and a drain coupled to the intermediate node.

The first logic inverter 710 further includes a set of NMOS FETs M40, M41, and M42 (e.g., three (3), but could be two (2), or four (4) or more) coupled in parallel between the intermediate node and a lower voltage rail Vss (e.g., ground). The set of NMOS FETs M40, M41, and M42 include respective drains coupled to the intermediate node, respective gates coupled to the input of the two-logic inverter stage 700, and sources coupled to the lower voltage rail Vss.

The second logic inverter 720 may be implemented per logic inverter 350 previously discussed in detail. In particular, the second logic inverter 720 includes a set of PMOS FETs M43, M44, and M45 (e.g., three (3), but could be two (2), or four (4) or more) coupled in series between the upper voltage rail Vdd and an output of the two-logic inverter stage 700. More specifically, the PMOS FET M43 includes a source coupled to the upper voltage rail Vdd, and a gate coupled to the intermediate node. The PMOS FET M44 includes a source coupled to a drain of PMOS FET M43, and a gate coupled to the intermediate node. The PMOS FET M45 includes a source coupled to a drain of PMOS FET M44, a gate coupled to the intermediate node, and a drain coupled to the output of the two-logic inverter stage 700.

The second logic inverter 720 further includes a set of NMOS FETs M46, M47, and M48 (e.g., three (3), but could be two (2), or four (4) or more) coupled in parallel between the output of the two-logic inverter stage 700 and the lower voltage rail Vss. The set of NMOS FETs M46, M47, and M48 include respective drains coupled to the output, respective gates coupled to the intermediate node, and sources coupled to the lower voltage rail Vss.

As previously discussed with regard to logic inverter 500, the voltage swing at the intermediate node of the first logic inverter 710 is not full rail-to-rail swing (e.g., between Vdd and Vss potentials). Instead, the voltage swing at the intermediate node is substantially between Vdd-$V_T$ and Vss potentials, where $V_T$ is the threshold voltage of the diode-connected PMOS FET M37. If the first logic inverter 710 were to be cascaded with other similarly-configured logic inverters in a ring oscillator (RO), the non-rail-to-rail swing of the logic inverters may not be sufficient to cause the RO to oscillate. Thus, the second logic inverter 720 (without the diode-connected PMOS FET) is able to generate rail-to-rail voltage swing at the output; and thus, the two-logic inverter stage 700 is able to be cascaded to form an RO capable of generating and sustaining an oscillating or periodic signal.

Figure 8:
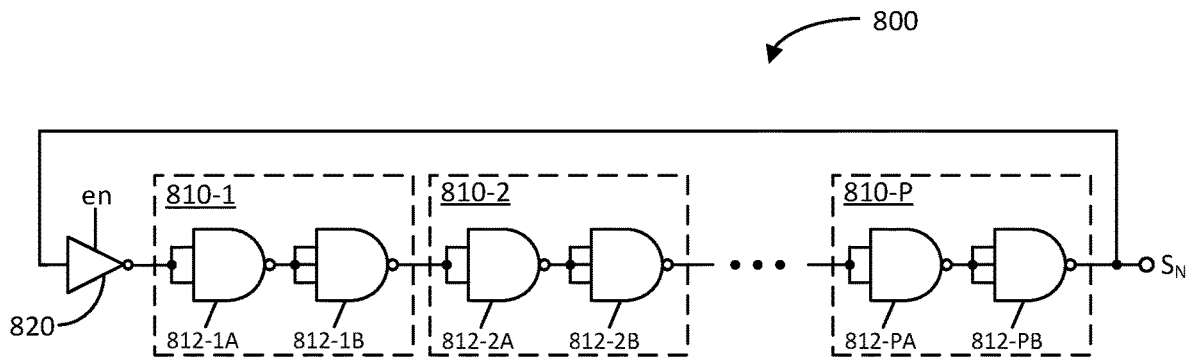
FIG. 8 illustrates a schematic diagram of another example ring oscillator (RO) implemented to assess n-channel field effect transistor (NFET) process performance in accordance with another aspect of the disclosure.

FIG. 8 illustrates a schematic diagram of another example ring oscillator (RO) 800 in accordance with another aspect of the disclosure. The RO 800 may be configured to generate a signal $S_N$ whose frequency $f_N$ is related to the process performance (e.g., skew) of the NMOS FETs used in the RO 800 (as well as other NMOS FETs in an integrated circuit (IC) incorporating the RO 800).

In particular, the RO 800 includes a set of cascaded stages 810-1 to 810-P, where P is a positive integer. Each of the cascaded stages 810-1 to 810-P may be implemented per the two-logic inverter stage 600 previously discussed. For example, the first cascaded stage 810-1 includes a first logic inverter 812-1A followed by a second logic inverter 812-1B; the second cascaded stage 810-2 includes a first logic inverter 812-2A followed by a second logic inverter 812-2B; and so on to the $P^{th}$ cascaded stage 810-P including a first logic inverter 812-PA followed by a second logic inverter 812-PB. Each of the first logic inverters 812-1A, 812-2A to 812-PA may be implemented per the first logic inverter 610 previously discussed. Similarly, each of the second logic inverters 812-1B, 812-2B to 812-PB may be implemented per the second logic inverter 620 previously discussed.

In the above arrangement, the output of the first logic inverter 812-1A is coupled to the input of the second logic inverter 812-1B of the first cascaded stage 810-1; the output of the first cascaded stage 810-1 is coupled to the input of the first logic inverter 812-2A of the second cascaded stage 810-2; the output of the first logic inverter 812-2A is coupled to the input of the second logic inverter 812-2B of the second cascaded stage 810-2; the output of the second cascaded stage 810-2 is coupled to the input the first logic inverter of the third cascaded stage (not shown); the input of the first logic inverter 812-PA is coupled to an output of the $p^{th}-1$ cascaded stage (not shown); the output of the first logic inverter 812-PA is coupled to the input of the second logic inverter 812-PB of the $P^{th}$ cascaded stage 810-P.

The output of the second logic inverter 812-PB of the $p^{th}$ cascaded 810-P is coupled to a first input of a selectively-enabled inverter 820. The selectively-enabled inverter 820 includes an output coupled to an input of the first logic inverter 812-1A of the first cascaded stage 810-1. The selectively-enabled inverter 820 includes a second input configured to receive an enable signal (en). The selectively-enabled inverter 820 may be implemented as a NAND gate including a first input coupled to the output of the second logic inverter 812-PB of the $p^{th}$ cascaded stage 810-P, a second input configured to receive the enable signal (en), and an output coupled to the input of the first logic inverter 812-1A of the first cascaded stage 810-1. Alternatively, the selectively-enabled inverter 820 may be implemented as a NOR gate including a first input coupled to the output of the second logic inverter 812-PB of the $P^{th}$ cascaded stage 810-P, a second input configured to receive the enable signal (en), and an output coupled to the input of the first logic inverter 812-1A of the first cascaded stage 810-1.

The selectively-enabled inverter 820 achieves the odd number of inverting stages (e.g., 2*P+1) to generate the periodic or oscillating signal $S_N$, when the enable signal (en) is asserted (e.g., a logic one (1) in the case of a NAND type selectively-enabled inverter 820, and a logic zero (0) in the case of a NOR type selectively-enabled inverter 820). When the enable signal (en) is deasserted (e.g., a logic zero (0) in the case of a NAND type selectively-enabled inverter 820, and a logic one (1) in the case of a NOR type selectively-enabled inverter 820), the selectively-enabled inverter 820 outputs a constant logic level (e.g., a logic one (1) in the case of a NAND type inverter 820; and a logic zero (0) in the case of a NOR type inverter 820); thereby disabling the RO 800 from generating the periodic or oscillating signal $S_N$.

Figure 9:
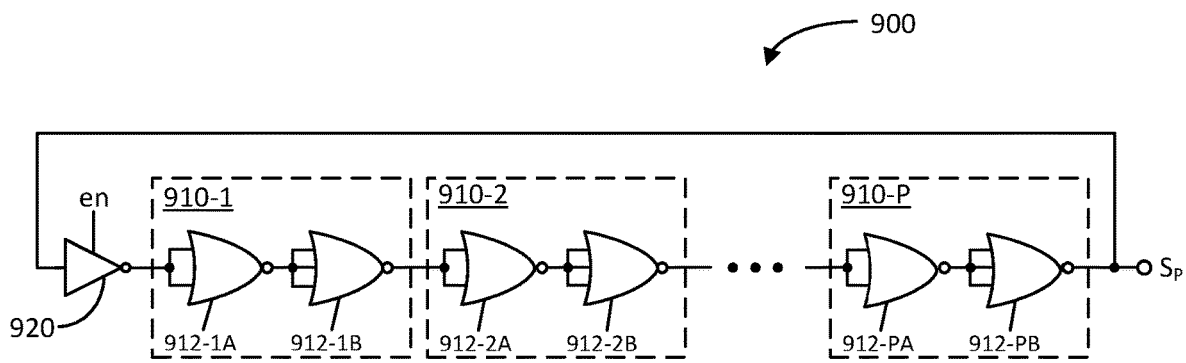
FIG. 9 illustrates a schematic diagram of another example ring oscillator (RO) implemented to assess p-channel field effect transistors (PFET) process performance in accordance with another aspect of the disclosure.

FIG. 9 illustrates a schematic diagram of another example ring oscillator (RO) 900 in accordance with another aspect of the disclosure. The RO 900 may be configured to generate a signal $S_P$ whose frequency $f_P$ is related to the process performance (e.g., skew) of PMOS FETs of the RO 900 (as well as other PMOS FETs in an integrated circuit (IC) incorporating the RO 900).

In particular, the RO 900 includes a set of cascaded stages 910-1 to 910-P, where P is a positive integer. Each of the cascaded stages 910-1 to 910-P may be implemented per the two-logic inverter stage 700 previously discussed. For example, the first cascaded stage 910-1 includes a first logic inverter 912-1A followed by a second logic inverter 912-1B; the second cascaded stage 910-2 includes a first logic inverter 912-2A followed by a second logic inverter 912-2B; and so on to the $P^{th}$ cascaded stage 910-P including a first logic inverter 912-PA followed by a second logic inverter 912-PB. Each of the first logic inverters 912-1A, 912-2A to 912-PA may be implemented per the first logic inverter 710 previously discussed. Similarly, each of the second logic inverters 912-1B, 912-2B to 912-PB may be implemented per the second logic inverter 720 previously discussed.

In the above arrangement, the output of the first logic inverter 912-1A is coupled to the input of the second logic inverter 912-1B of the first cascaded stage 910-1; the output of the first cascaded stage 910-1 is coupled to the input of the first logic inverter 912-2A of the second cascaded stage 910-2; the output of the first logic inverter 912-2A is coupled to the input of the second logic inverter 912-2B of the second cascaded stage 910-2; the output of the second cascaded stage 910-2 is coupled to the input the first logic inverter of the third cascaded stage (not shown); the input of the first logic inverter 912-PA is coupled to an output of the $p^{th}-1$ cascaded stage (not shown); the output of the first logic inverter 912-PA is coupled to the input of the second logic inverter 912-PB of the $P^{th}$ cascaded stage 910-P.

The output of the second logic inverter 912-PB of the $p^{th}$ cascaded stage 910-P is coupled to a first input of a selectively-enabled inverter 920. The selectively-enabled inverter 920 includes an output coupled to an input of the first logic inverter 912-1A of the first cascaded stage 910-1. The selectively-enabled inverter 920 includes a second input configured to receive an enable signal (en). The selectively-enabled inverter 920 may be implemented as a NAND gate including a first input coupled to the output of the second logic inverter 912-PB of the $p^{th}$ cascaded stage 910-P, a second input configured to receive the enable signal (en), and an output coupled to the input of the first logic inverter 912-1A of the first cascaded stage 910-1. Alternatively, the selectively-enabled inverter 920 may be implemented as a NOR gate including a first input coupled to the output of the second logic inverter 912-PB of the $P^{th}$ cascaded stage 910-P, a second input configured to receive the enable signal (en), and an output coupled to the input of the first logic inverter 912-1A of the first cascaded stage 910-1.

The selectively-enabled inverter 920 achieves the odd number of inverting stages (e.g., 2*P+1) to generate the periodic or oscillating signal $S_P$, when the enable signal (en) is asserted (e.g., a logic one (1) in the case of a NAND type selectively-enabled inverter 920, and a logic zero (0) in the case of a NOR type selectively-enabled inverter 920). When the enable signal (en) is deasserted (e.g., a logic zero (0) in the case of a NAND type selectively-enabled inverter 920, and a logic one (1) in the case of a NOR type selectively-enabled inverter 920), the selectively-enabled inverter 920 outputs a constant logic level (e.g., a logic one (1) in the case of a NAND type inverter 920; and a logic zero (0) in the case of a NOR type inverter 920); thereby disabling the RO 900 from generating the periodic or oscillating signal $S_P$.

Figure 10:
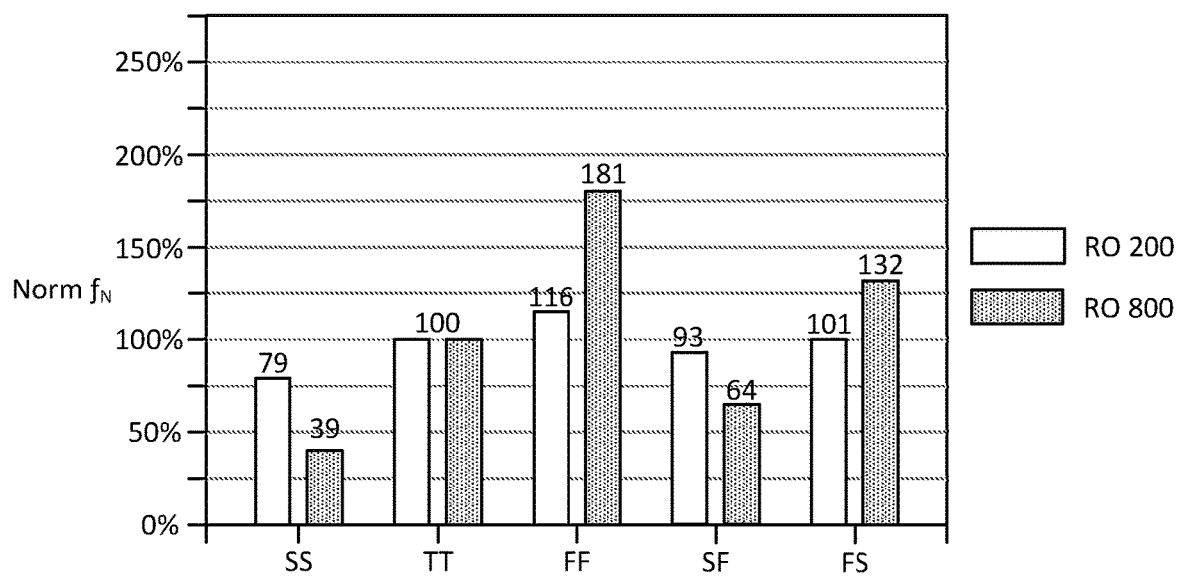
FIG. 10 illustrates a bar chart comparing different logic inverters for assessing n-channel field effect transistors (NFET) process performance in accordance with another aspect of the disclosure.

FIG. 10 illustrates a bar chart comparing different logic inverters for assessing n-channel field effect transistors (NFETs) process performance in accordance with another aspect of the disclosure. The x- or horizontal-axis of the bar chart represents different process corners SS, FF, SF, and FS including a reference (e.g., average or mean) process corner TT. The y- or vertical axis of the bar chart represents frequency $f_N$ of a signal $S_N$ (as a percentage of a normalized frequency) generated by a ring oscillator (RO) used to characterize process performance of NFETs. The y- or vertical-axis has a range from zero (0) percent (%) to above 250%. The non-shaded bars represent the frequency $f_N$ of a signal $S_N$ generated by the RO 200, and the shaded bars represent the frequency $f_N$ of a signal $S_N$ generated by the RO 800.

With regard to the reference process corner TT, the ROs 200 and 800 each generate a signal $S_N$ with a normalized frequency $f_N$ at 100%. At the SS process corner, the RO 200 generates a signal $S_N$ with a frequency $f_N$ of 79% of the normalized frequency, whereas the RO 800 generates a signal $S_N$ with a frequency $f_N$ of 39% of the normalized frequency. At the FF process corner, the RO 200 generates a signal $S_N$ with a frequency $f_N$ at 116% of the normalized frequency, whereas the RO 800 generates a signal $S_N$ with a frequency $f_N$ at 181% of the normalized frequency. At the SF process corner, the RO 200 generates a signal $S_N$ with a frequency $f_N$ at 93% of the normalized frequency, whereas the RO 800 generates a signal $S_N$ with a frequency $f_N$ at 64% of the normalized frequency. And, at the FS process corner, the RO 200 generates a signal $S_N$ with a frequency $f_N$ at 101% of the normalized frequency, whereas the RO 800 generates a signal $S_N$ with a frequency $f_N$ at 132% of the normalized frequency.

As previously discussed, the RO 200 includes a set of cascaded logic inverters 210-1 to 210-K (e.g., the NAND type logic inverter 250 without the diode-connected NMOS FET). Whereas, the RO 800 includes a set of cascaded stages 810-1 to 810-P including first logic inverters 812-1A to 812-PA with diode-connected NMOS FETs, respectively. Thus, the bar chart shows that the sensitivity to the NFET process performance is significantly improved with the RO 800 over the RO 200 since the difference in frequency for the process corners SS, FF, SF, and FS compared to the normalized frequency of the normalized corner TT is significantly greater for the RO 800 compared to the RO 200.

Figure 11:
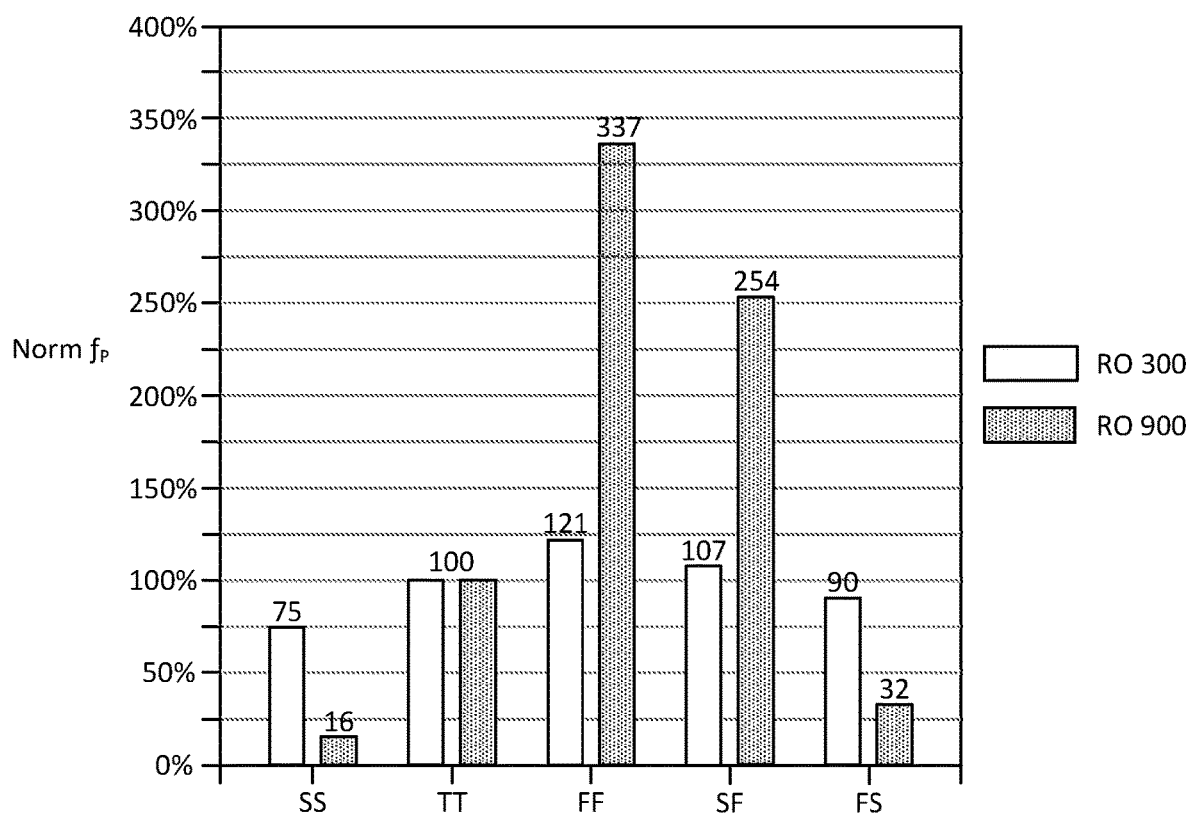
FIG. 11 illustrates a bar chart comparing different logic inverters for assessing p-channel field effect transistor (PFET) process performance in accordance with another aspect of the disclosure.

FIG. 11 illustrates a bar chart comparing different logic inverters for assessing p-channel field effect transistors (PFETs) process performance in accordance with another aspect of the disclosure. The x- or horizontal-axis of the bar chart represents different process corners SS, FF, SF, and FS including a reference (e.g., average or mean) process corner TT. The y- or vertical axis of the bar chart represents frequency $f_P$ of a signal $S_P$ (as a percentage of a normalized frequency) generated by a ring oscillator (RO) used to characterize process performance of PFETs. The y- or vertical-axis has a range from zero (0) percent (%) to 400%. The non-shaded bars represent the frequency $f_P$ of a signal $S_P$ generated by the RO 300, and the shaded bars represent the frequency $f_P$ of a signal $S_P$ generated by the RO 900.

With regard to the reference process corner TT, the ROs 300 and 900 each generate a signal $S_P$ with a normalized frequency $f_P$ at 100%. At the SS process corner, the RO 300 generates a signal $S_P$ with a frequency $f_P$ at 75% of the normalized frequency, whereas the RO 900 generates a signal $S_P$ with a frequency $f_P$ at 16% of the normalized frequency. At the FF process corner, the RO 300 generates a signal $S_P$ with a frequency $f_P$ at 121% of the normalized frequency, whereas the RO 900 generates a signal $S_P$ with a frequency $f_P$ at 337% of the normalized frequency. At the SF process corner, the RO 300 generates a signal $S_P$ with a frequency $f_P$ at 107% of the normalized frequency, whereas the RO 900 generates a signal $S_P$ with a frequency $f_P$ at 254% of the normalized frequency. And, at the FS process corner, the RO 300 generates a signal $S_p$ with a frequency $f_P$ at 90% of the normalized frequency, whereas the RO 900 generates a signal $S_P$ with a frequency $f_P$ at 32% of the normalized frequency.

Similarly, as previously discussed, the RO 300 includes a set of cascaded logic inverters 310-1 to 310-K (e.g., the NOR type logic inverter 350 without the diode-connected NMOS FET). Whereas, the RO 900 includes a set of cascaded stages 910-1 to 910-P including first logic inverters 912-1A to 912-PA with diode-connected PMOS FETs, respectively. Thus, the bar chart shows that the sensitivity to the PFET process performance is significantly improved with the RO 900 over the RO 300 since the difference in frequency for the process corners SS, FF, SF, and FS compared to the normalized frequency of the reference process corner TT is significantly greater for the RO 900 compared to the RO 300.

Figure 12:
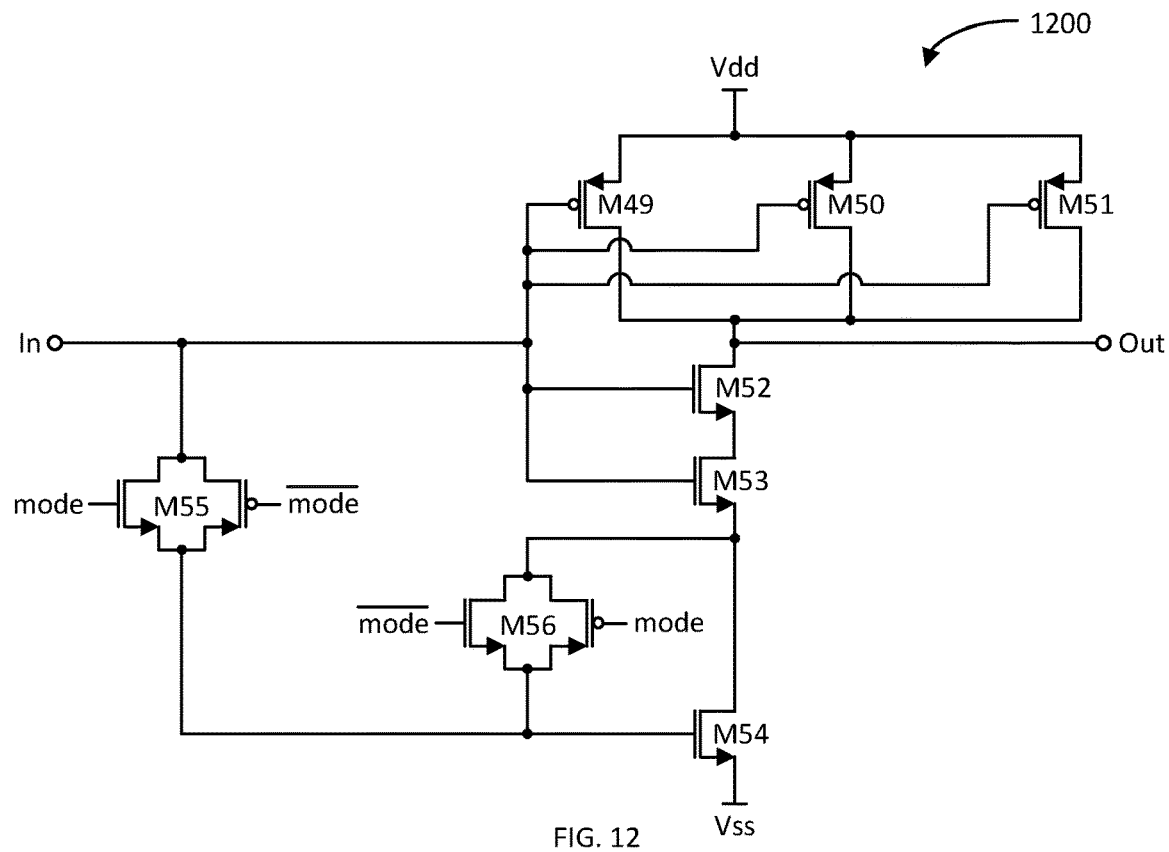
FIG. 12 illustrates a schematic diagram of an example logic inverter of a ring oscillator (RO) implemented to assess n-channel field effect transistor (NFET) process aging performance in accordance with another aspect of the disclosure.

FIG. 12 illustrates a schematic diagram of an example reconfigurable logic inverter 1200 in accordance with another aspect of the disclosure. As discussed further herein, the reconfigurable logic inverter 1200 may be used in a ring oscillator (RO) used to characterized process performance of NFETs. For example, the reconfigurable logic inverter 1200 may be used as the first logic inverters 812-1A, 812-2A to 812-PA of the set of cascaded stages 810-1 to 810-P of RO 800, respectively. Also, as discussed further herein, the reconfigurable logic inverter 1200 may be reconfigured for applying aging stress condition or for process performance measurement/monitoring based on a mode signal.

In particular, the reconfigurable logic inverter 1200 is similar to logic inverter 400. For example, the reconfigurable logic inverter 1200 includes a set of PMOS FETs M49, M50, and M51 (e.g., three (3), but could be two (2), or four (4) or more) coupled in parallel between an upper voltage rail Vdd and an output of the reconfigurable logic inverter 1200. More specifically, the PMOS FETs M49, M50, and M51 include respective sources coupled to the upper voltage rail Vdd, respective gates coupled to an input of the reconfigurable logic inverter 1200, and respective drains coupled to the output of the reconfigurable logic inverter 1200.

The reconfigurable logic inverter 1200 further includes a set of NMOS FETs M52, M53, and M54 (e.g., three (3), but could be two (2), or four (4) or more) coupled in series between the output of the reconfigurable logic inverter 1200 and a lower voltage rail Vss (e.g., ground). More specifically, the NMOS FET M52 includes a drain coupled to the output of the reconfigurable logic inverter 1200, and a gate coupled to the input of the reconfigurable logic inverter 1200. The NMOS FET M53 includes a drain coupled to a source of NMOS FET M52, and a gate coupled to the input of the reconfigurable logic inverter 1200.

As discussed in more detail further herein, in the reconfigurable implementation, the NMOS FET M54 may not be diode-connected if a mode signal indicates an aging stress mode of operation. In such case, the NMOS FET M54 includes a drain coupled to a source of NMOS FET M53, a gate coupled to the input of the reconfigurable logic inverter 1200, and a source coupled to the lower voltage rail Vss. The NMOS FET M54 may be diode-connected if the mode signal indicates a process performance measurement/monitoring mode of operation. In such case, the NMOS FET M54 includes drain and gate coupled together, and to the source of NMOS FET M53, and a source coupled to the lower voltage rail Vss.

To effectuate the non-diode connection and diode connection of the NMOS FET M54, the reconfigurable logic inverter 1200 further includes a first switching device M55 and a second switching device M56. In this example, the first and second switching devices M55 and M56 may be implemented as transmission gates, but it shall be understood that the first and second switching devices M55 and M56 may be implemented as other types of switching devices.

The first switching device M55 includes a first terminal coupled to the input of the reconfigurable logic inverter 1200, and a second terminal coupled to the gate of the NMOS FET M54. The first switching device M55 further includes non-complementary and complementary control inputs configured to receive a non-complementary mode signal (mode) and a complementary mode signal ($\overline{\text{mode}}$), respectively. The second switching device M56 includes a first terminal coupled to the drain of NMOS FET M54, and a second terminal coupled to the gate of the NMOS FET M54. The second switching device M56 further includes non-complementary and complementary control inputs configured to receive the complementary mode signal ($\overline{mode}$) and the non-complementary mode signal (mode), respectively.

For aging stress purposes, it is desired that the output of the reconfigurable logic inverter 1200 achieves full rail-to-rail voltage swing so that the aging of the NMOS FETs M52, M53, and M54 is consistent with the aging of other NMOS FETs in the IC or in the vicinity thereof. For improved NFET process measurement/monitoring sensitivity of the NMOS FETs M52, M53, and M54, it is desired for the reconfigurable logic inverter 1200 to include the diode-connected NMOS FET M54 as previously discussed.

Accordingly, if the mode signal indicates the aging stress mode of operation (e.g., mode=1, $\overline{mode}$=0), the first switching device M55 is turned on, and the second switching device M56 is turned off. The turned-on first switching device M55 couples the input of the reconfigurable logic inverter 1200 to the gate of the NMOS FET M54 so that full rail-to-rail voltage swing is achieved at the output of the reconfigurable logic inverter 1200. If the mode signal indicates the process measurement/monitoring mode of operation (e.g., mode=0, $\overline{mode}$=1), the first switching device M55 is turned off, and the second switching device M56 is turned on. The turned-on second switching device M56 couples together the drain and gate of the NMOS FET M54 to configure the device M54 as a diode-connected NMOS FET for improved NFET process measurement sensitivity.

Figure 13:
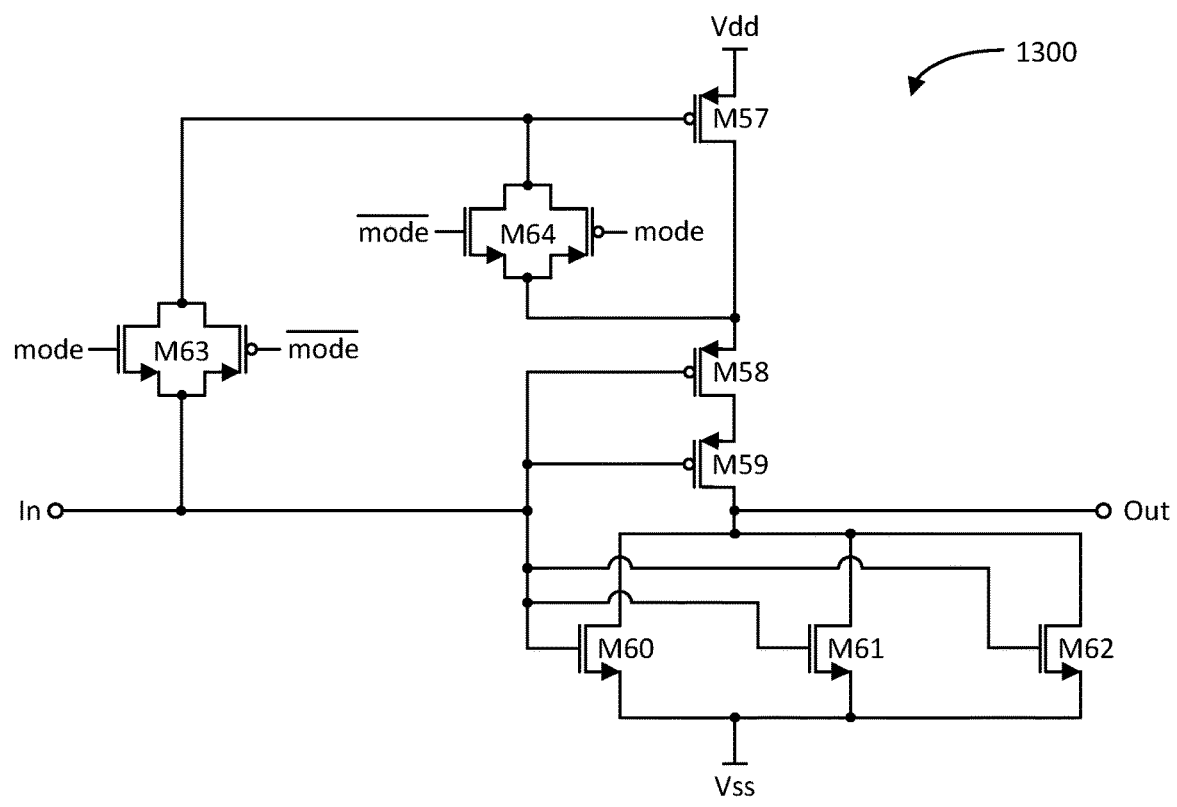
FIG. 13 illustrates a schematic diagram of an example logic inverter of a ring oscillator (RO) implemented to assess p-channel field effect transistor (PFETs) process aging performance in accordance with another aspect of the disclosure.

FIG. 13 illustrates a schematic diagram of an example reconfigurable logic inverter 1300 in accordance with another aspect of the disclosure. As discussed further herein, the reconfigurable logic inverter 1300 may be used in a ring oscillator (RO) used to characterized process performance of PFETs. For example, the reconfigurable logic inverter 1300 may be used as the first logic inverters 912-1A, 912-2A to 912-PA of the set of cascaded stages 910-1 to 910-P of RO 900, respectively. Also, as discussed further herein, the reconfigurable logic inverter 1300 may be reconfigured for applying aging stress condition or for process performance measurement/monitoring based on a mode signal.

In particular, the reconfigurable logic inverter 1300 is similar to logic inverter 500. For example, the reconfigurable logic inverter 1300 includes a set of PMOS FETs M57, M58, and M59 (e.g., three (3), but could be two (2), or four (4) or more) coupled in series between an upper voltage rail Vdd and an output of the reconfigurable logic inverter 1300. In the reconfigurable implementation, the PMOS FET M57 may not be diode-connected if a mode signal indicates an aging stress mode of operation. In such case, the PMOS FET M57 includes a source coupled to the upper voltage rail Vdd, and a gate coupled to the input of the reconfigurable logic inverter 1300. The PMOS FET M57 may be diode-connected if the mode signal indicates a process performance measurement/monitoring mode of operation. In such case, the PMOS FET M57 includes a source coupled to the upper voltage rail Vdd, and gate and drain coupled together.

The PMOS FET M58 includes a source coupled to the drain (aging stress mode of operation) or gate/drain (process measurement/monitoring mode of operation) of PMOS FET M57, and a gate coupled to the input of the reconfigurable logic inverter 1300. The PMOS FET M59 includes a source coupled to a drain of PMOS FET M58, a gate coupled to the input of the reconfigurable logic inverter 1300, and a drain coupled to the output of the reconfigurable logic inverter 1300.

The reconfigurable logic inverter 1300 further includes a set of NMOS FETs M60, M61, and M62 (e.g., three (3), but could be two (2), or four (4) or more) coupled in parallel between the output of the reconfigurable logic inverter 1300 and a lower voltage rail Vss (e.g., ground). More specifically, the NMOS FETs M60, M61, and M62 include respective drains coupled to the output of the reconfigurable logic inverter 1300, respective gates coupled to the input of the reconfigurable logic inverter 1300, and respective sources coupled to the lower voltage rail Vss.

To effectuate the non-diode connection and diode connection of the PMOS FET M57, the reconfigurable logic inverter 1300 further includes a first switching device M63 and a second switching device M64. In this example, the first and second switching devices M63 and M64 may be implemented as transmission gates, but it shall be understood that the first and second switching devices M63 and M64 may be implemented as other types of switching devices.

The first switching device M63 includes a first terminal coupled to the input of the reconfigurable logic inverter 1300, and a second terminal coupled to the gate of the PMOS FET M57. The first switching device M63 further includes non-complementary and complementary control inputs configured to receive a non-complementary mode signal (mode) and a complementary mode signal ($\overline{mode}$), respectively. The second switching device M64 includes a first terminal coupled to the drain of PMOS FET M57, and a second terminal coupled to the gate of the PMOS FET M57. The second switching device M64 further includes non-complementary and complementary control inputs configured to receive the complementary mode signal ($\overline{mode}$) and the non-complementary mode signal (mode), respectively.

As previously discussed, for aging stress purposes, it is desired that the output of the reconfigurable logic inverter 1200 achieves full rail-to-rail voltage swing so that the aging of the PMOS FETs M57, M58, and M59 is consistent with the aging of other PMOS FETs in the IC or in the vicinity thereof. For improved PFET process measurement/monitoring sensitivity of the PMOS FETs M57, M58, and M59, it is desired for the reconfigurable logic inverter 1300 to include the diode-connected PMOS FET M57 as previously discussed.

Accordingly, if the mode signal indicates the aging stress mode of operation (e.g., mode=1, $\overline{mode}$=0), the first switching device M63 is turned on, and the second switching device M64 is turned off. The turned-on first switching device M63 couples the input of the reconfigurable logic inverter 1300 to the gate of the PMOS FET M57 so that full rail-to-rail voltage swing is achieved at the output of the reconfigurable logic inverter 1300. If the mode signal indicates the process measurement/monitoring mode of operation (e.g., mode=0, $\overline{mode}$=1), the first switching device M63 is turned off, and the second switching device M64 is turned on. The turned-on second switching device M64 couples together the gate and drain of the PMOS FET M57 to configure the device M57 as a diode-connected PMOS FET for improved PFET process measurement/monitoring sensitivity.

Figure 14:
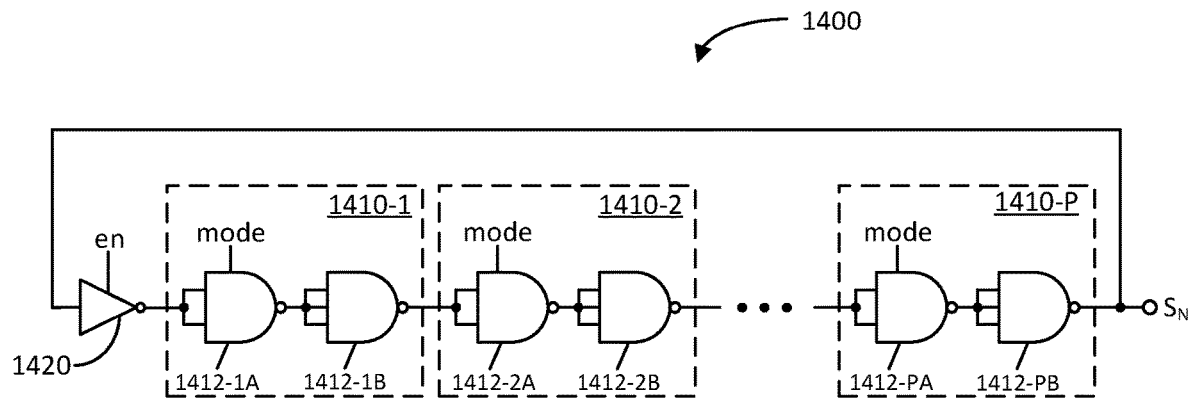
FIG. 14 illustrates a schematic diagram of another example ring oscillator (RO) implemented to assess n-channel field effect transistor (NFET) process aging performance in accordance with another aspect of the disclosure.

FIG. 14 illustrates a schematic diagram of another example ring oscillator (RO) 1400 in accordance with another aspect of the disclosure. The RO 1400 may be configured to generate a signal $S_N$ whose frequency $f_N$ is related to the process performance (e.g., skew) of the NMOS FETs used in the RO 1400 (as well as other NMOS FETs in an integrated circuit (IC) incorporating the RO 1400).

In particular, the RO 1400 includes a set of cascaded stages 1410-1 to 1410-P, where P is a positive integer. Each of the cascaded stages 1410-1 to 1410-P may include a first logic inverter followed by a second logic inverter. For example, the first cascaded stage 1410-1 includes a first logic inverter 1412-1A followed by a second logic inverter 1412-1B; the second cascaded stage 1410-2 includes a first logic inverter 1412-2A followed by a second logic inverter 1412-2B; and so on to the $P^{th}$ cascaded stage 1410-P including a first logic inverter 1412-PA followed by a second logic inverter 1412-PB. Each of the first logic inverters 1412-1A, 1412-2A to 1412-PA may be implemented per the reconfigurable logic inverter 1200 previously discussed. Accordingly, each of the first logic inverters 1412-1A, 1412-2A to 1412-PA is configured to receive the mode signal. As previously discussed, the mode signal may indicate an aging stress mode or a process measurement/monitoring mode. Similarly, each of the second logic inverters 1412-1B, 1412-2B to 1412-PB may be implemented per the logic inverter 250 previously discussed.

In the above arrangement, the output of the first logic inverter 1412-1A is coupled to the input of the second logic inverter 1412-1B of the first cascaded stage 1410-1; the output of the first cascaded stage 1410-1 is coupled to the input of the first logic inverter 1412-2A of the second cascaded stage 1410-2; the output of the first logic inverter 1412-2A is coupled to the input of the second logic inverter 1412-2B of the second cascaded stage 1410-2; the output of the second cascaded stage 1410-2 is coupled to the input the first logic inverter of the third cascaded stage (not shown); the input of the first logic inverter 1412-PA is coupled to an output of the $P^{th}-1$ cascaded stage (not shown); the output of the first logic inverter 1412-PA is coupled to the input of the second logic inverter 1412-PB of the $P^{th}$ cascaded stage 1410-P.

The output of the second logic inverter 1412-PB of the $P^{th}$ cascaded stage 1410-P is coupled to a first input of a selectively-enabled inverter 1420. The selectively-enabled inverter 1420 includes an output coupled to an input of the first logic inverter 1412-1A of the first cascaded stage 1410-1. The selectively-enabled inverter 1420 includes a second input configured to receive an enable signal (en). The selectively-enabled inverter 1420 may be implemented as a NAND gate including a first input coupled to the output of the second logic inverter 1412-PB of the $P^{th}$ cascaded stage 1410-P, a second input configured to receive the enable signal (en), and an output coupled to the input of the first logic inverter 1412-1A of the first cascaded stage 1410-1. Alternatively, the selectively-enabled inverter 1420 may be implemented as a NOR gate including a first input coupled to the output of the second logic inverter 1412-PB of the $P^{th}$ cascaded stage 1410-P, a second input configured to receive the enable signal (en), and an output coupled to the input of the first logic inverter 1412-1A of the first cascaded stage 1410-1.

The selectively-enabled inverter 1420 achieves the odd number of inverting stages (e.g., 2*P+1) to generate the periodic or oscillating signal $S_N$, when the enable signal (en) is asserted (e.g., a logic one (1) in the case of a NAND type selectively-enabled inverter 1420, and a logic zero (0) in the case of a NOR type selectively-enabled inverter 1420). When the enable signal (en) is deasserted (e.g., a logic zero (0) in the case of a NAND type selectively-enabled inverter 1420, and a logic one (1) in the case of a NOR type selectively-enabled inverter 1420), the selectively-enabled inverter 1420 outputs a constant logic level (e.g., a logic one (1) in the case of a NAND type inverter 1420; and a logic zero (0) in the case of a NOR type inverter 1420); thereby disabling the RO 1400 from generating the periodic or oscillating signal $S_N$.

Figure 15:
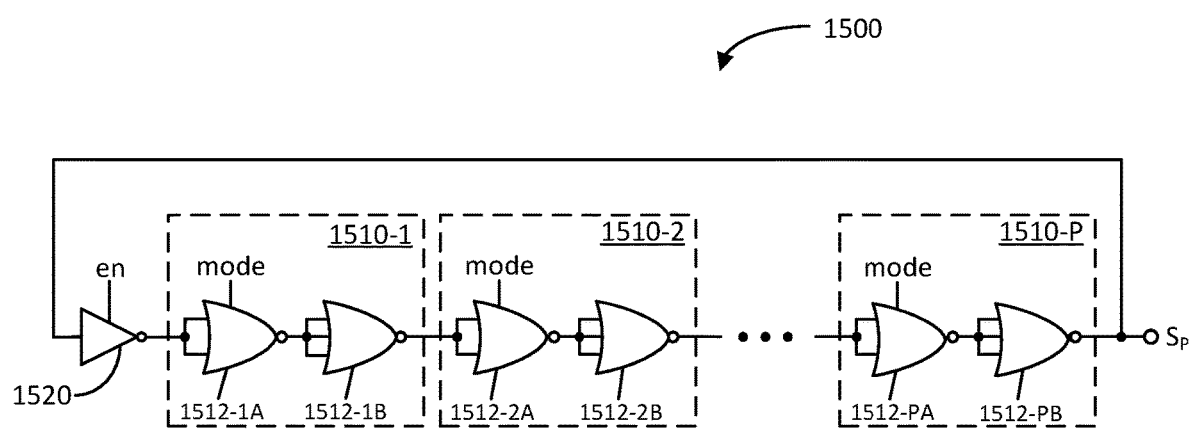
FIG. 15 illustrates a schematic diagram of another example ring oscillator (RO) implemented to assess p-channel field effect transistor (PFET) process aging performance in accordance with another aspect of the disclosure.

FIG. 15 illustrates a schematic diagram of another example ring oscillator (RO) 1500 in accordance with another aspect of the disclosure. The RO 1500 may be configured to generate a signal $S_P$ whose frequency $f_P$ is related to the process performance (e.g., skew) of the PMOS FETs used in the RO 1500 (as well as other PMOS FETs in an integrated circuit (IC) incorporating the RO 1500).

In particular, the RO 1500 includes a set of cascaded stages 1510-1 to 1510-P, where P is a positive integer. Each of the cascaded stages 1510-1 to 1510-P may include a first logic inverter followed by a second logic inverter. For example, the first cascaded stage 1510-1 includes a first logic inverter 1512-1A followed by a second logic inverter 1512-11B; the second cascaded stage 1510-2 includes a first logic inverter 1512-2A followed by a second logic inverter 1512-2B; and so on to the $P^{th}$ cascaded stage 1510-P including a first logic inverter 1512-PA followed by a second logic inverter 1512-PB. Each of the first logic inverters 1512-1A, 1512-2A to 1512-PA may be implemented per the reconfigurable logic inverter 1300 previously discussed. Accordingly, each of the first logic inverters 1512-1A, 1512-2A to 1512-PA is configured to receive the mode signal. As previously discussed, the mode signal may indicate an aging stress mode or a process measurement/monitoring mode. Similarly, each of the second logic inverters 1512-1B, 1512-2B to 1512-PB may be implemented per the logic inverter 350 previously discussed.

In the above arrangement, the output of the first logic inverter 1512-1A is coupled to the input of the second logic inverter 1512-1B of the first cascaded stage 1510-1; the output of the first cascaded stage 1510-1 is coupled to the input of the first logic inverter 1512-2A of the second cascaded stage 1510-2; the output of the first logic inverter 1512-2A is coupled to the input of the second logic inverter 1512-2B of the second cascaded stage 1510-2; the output of the second cascaded stage 1510-2 is coupled to the input the first logic inverter of the third cascaded stage (not shown); the input of the first logic inverter 1512-PA is coupled to an output of the $P^{th}-1$ cascaded stage (not shown); the output of the first logic inverter 1512-PA is coupled to the input of the second logic inverter 1512-PB of the $P^{th}$ cascaded stage 1510-P.

The output of the second logic inverter 1512-PB of the $P^{th}$ cascaded stage 1510-P is coupled to a first input of a selectively-enabled inverter 1520. The selectively-enabled inverter 1520 includes an output coupled to an input of the first logic inverter 1512-1A of the first cascaded stage 1510-1. The selectively-enabled inverter 1520 includes a second input configured to receive an enable signal (en). The selectively-enabled inverter 1520 may be implemented as a NAND gate including a first input coupled to the output of the second logic inverter 1512-PB of the $P^{th}$ cascaded stage 1510-P, a second input configured to receive the enable signal (en), and an output coupled to the input of the first logic inverter 1512-1A of the first cascaded stage 1510-1. Alternatively, the selectively-enabled inverter 1520 may be implemented as a NOR gate including a first input coupled to the output of the second logic inverter 1512-PB of the $P^{th}$ cascaded stage 1510-P, a second input configured to receive the enable signal (en), and an output coupled to the input of the first logic inverter 1512-1A of the first cascaded stage 1510-1.

The selectively-enabled inverter 1520 achieves the odd number of inverting stages (e.g., 2*P+1) to generate the periodic or oscillating signal $S_P$, when the enable signal (en) is asserted (e.g., a logic one (1) in the case of a NAND type selectively-enabled inverter 1520, and a logic zero (0) in the case of a NOR type selectively-enabled inverter 1520). When the enable signal (en) is deasserted (e.g., a logic zero (0) in the case of a NAND type selectively-enabled inverter 1520, and a logic one (1) in the case of a NOR type selectively-enabled inverter 1520), the selectively-enabled inverter 1520 outputs a constant logic level (e.g., a logic one (1) in the case of a NAND type inverter 1520; and a logic zero (0) in the case of a NOR type inverter 1520); thereby disabling the RO 1500 from generating the periodic or oscillating signal $S_P$.

Figure 16:
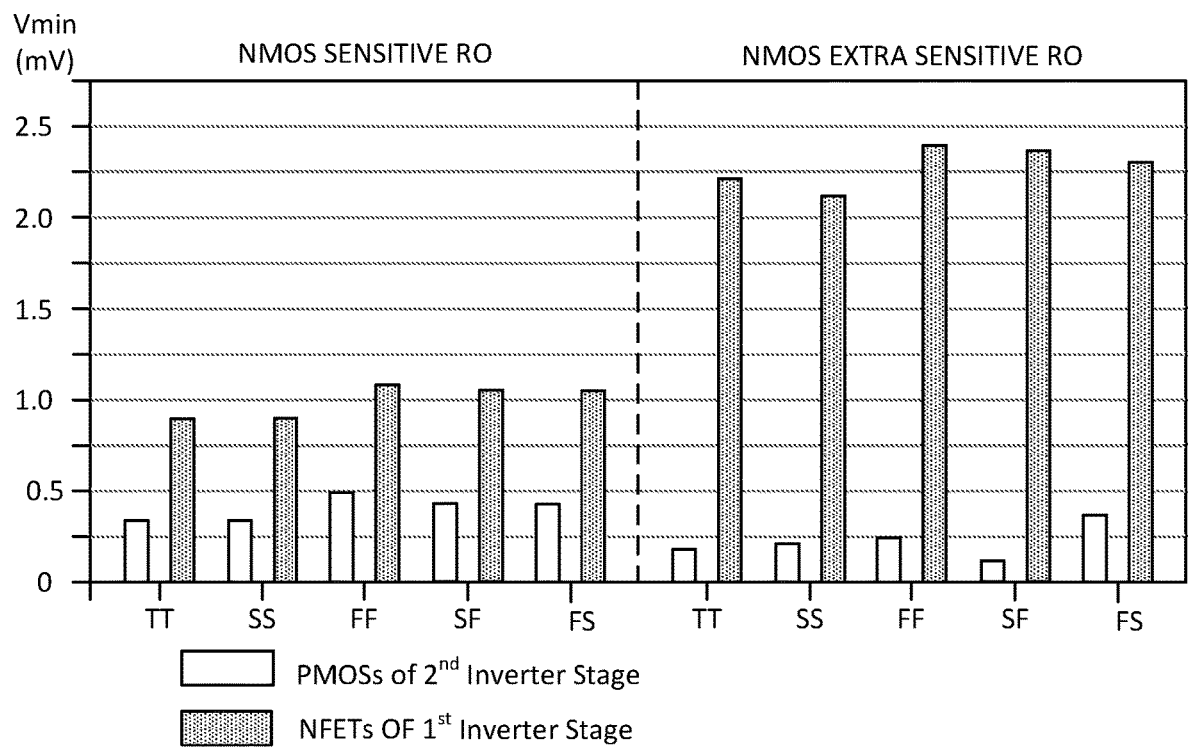
FIG. 16 illustrates a bar chart comparing PFET process contribution to NFET process contribution to a frequency of a signal generated by a ring oscillator (RO) implemented to assess n-channel field effect transistor (NFET) process aging performance in accordance with another aspect of the disclosure.

FIG. 16 illustrates a bar chart comparing the PFET process contribution and NFET process contribution to a frequency $f_N$ of a signal $S_N$ generated by the ring oscillator (RO) implemented to assess n-channel field effect transistor (NFET) process aging performance.

The left-half of the x- or horizontal-axis of the bar chart represents different process corners SS, FF, SF, and FS including a reference (e.g., average or mean) process corner TT for the RO 200. The right-half of the x- or horizontal-axis of the bar chart represents different process corners SS, FF, SF, and FS including a reference (e.g., average or mean) process corner TT for the RO 1400. The y- or vertical axis of the bar chart represents the minimum voltage increase Vmin to the supply voltage Vdd to bring the frequency $f_N$ of the signal $S_N$ to a normalized (pre-$V_T$ degrading) frequency in response to degrading the threshold voltage $V_T$ of the PMOS FETs and NMOS FETs of the RO by one (1) milli Volt (mV). In other words, the bar chart shows how many mV of Vmin degradation is caused by one (1) mV of $V_T$ shift in NMOS/PMOS chain. The y- or vertical axis is in millivolts (mV) ranging from 0 mV to above 2.5 mV.

Considering the RO 200, for the reference process corner TT, the Vmin is about 0.3 mV for the PMOS FETs and about 0.85 mV for the NMOS FETs; for the process corner SS, the Vmin is about 0.3 mV for the PMOS FETs and about 0.85 mV for the NMOS FETs; for the process corner FF, the Vmin is about 0.5 mV for the PMOS FETs and 1.1 mV for the NMOS FETs; for the process corner SF, the Vmin is about 0.4 mV for the PMOS FETs and 1.05 mV for the NMOS FETs; and for the process corner FS, the Vmin is about 0.4 mV for the PMOS FETs and 1.05 mV for the NMOS FETs.

Considering the RO 1400, for the reference process corner TT, the Vmin is about 0.2 mV for the PMOS FETs and about 2.2 mV for the NMOS FETs; for the process corner SS, the Vmin is about 2.25 mV for the PMOS FETs and about 2.1 mV for the NMOS FETs; for the process corner FF, the Vmin is about 0.25 mV for the PMOS FETs and 2.4 mV for the NMOS FETs; for the process corner SF, the Vmin is about 0.1 mV for the PMOS FETs and 2.35 mV for the NMOS FETs; and for the process corner FS, the Vmin is about 0.3 mV for the PMOS FETs and 2.3 mV for the NMOS FETs.

Accordingly, the bar chart shows that by including the diode-connected NMOS in the stages of RO 1400, the sensitivity to the NMOS process performance is significantly improved over the sensitivity to the NMOS process of the RO 200. Further, the NBTI/PBTI separation is much higher with diode-connected FET RO 1400 compared to all input-connected gate FET RO 200. For example, from a two-to-one NBTI/PBTI separation with the all input-connected gate FET RO 200 to 10-to-one NBTI/PBTI separation for the diode-connected RO 1400.

Figure 17:
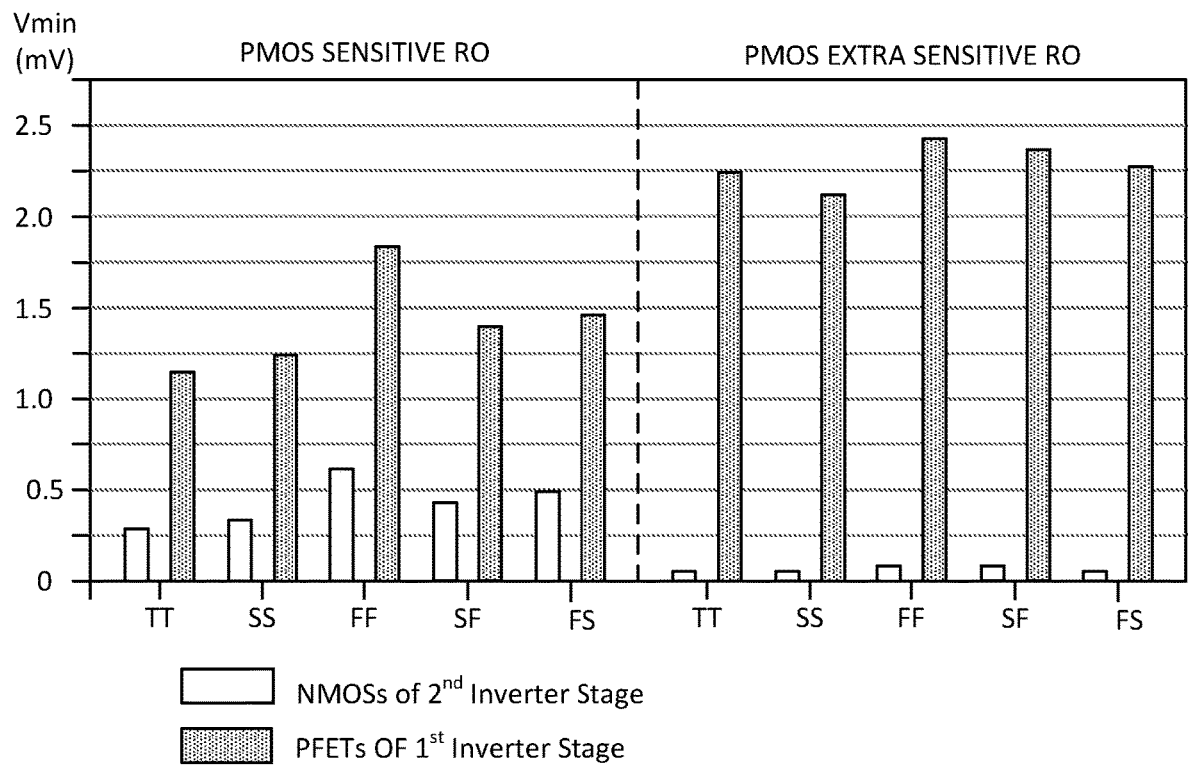
FIG. 17 illustrates a bar chart comparing NFET process contribution to PFET process contribution to a frequency of a signal generated by a ring oscillator (RO) implemented to assess p-channel field effect transistor (PFET) process aging performance in accordance with another aspect of the disclosure.

FIG. 17 illustrates a bar chart comparing NFET process contribution to PFET process contribution to a frequency $f_P$ of a signal $S_P$ generated by a ring oscillator (RO) implemented to assess p-channel field effect transistor (PFET) process aging performance in accordance with another aspect of the disclosure.

Similarly, the left-half of the x- or horizontal-axis of the bar chart represents different process corners SS, FF, SF, and FS including a reference (e.g., average or mean) process corner TT for the RO 300. The right-half of the x- or horizontal-axis of the bar chart represents different process corners SS, FF, SF, and FS including a reference (e.g., average or mean) process corner TT for the RO 1500. The y- or vertical axis of the bar chart represents the minimum voltage increase Vmin to the supply voltage Vdd to bring the frequency $f_P$ of the signal $S_P$ to a normalized (pre-$V_T$ degrading) frequency in response to degrading the threshold voltage $V_T$ of the NMOS FETs and PMOS FETs of the RO by one (1) mV. In other words, the bar chart shows how many mV of Vmin degradation is caused by one (1) mV of $V_T$ shift in NMOS/PMOS chain. The y- or vertical axis is in millivolts (mV) ranging from 0 mV to above 2.5 mV.

Considering the RO 300, for the reference process corner TT, the Vmin is about 0.25 mV for the NMOS FETs and about 1.15 mV for the PMOS FETs; for the process corner SS, the Vmin is about 0.3 mV for the NMOS FETs and about 1.25 mV for the PMOS FETs; for the process corner FF, the Vmin is about 0.6 mV for the NMOS FETs and 1.8 mV for the PMOS FETs; for the process corner SF, the Vmin is about 0.4 mV for the NMOS FETs and 1.4 mV for the PMOS FETs; and for the process corner FS, the Vmin is about 0.5 mV for the NMOS FETs and 1.45 mV for the PMOS FETs.

Considering the RO 1500, for the reference process corner TT, the Vmin is about 0.1 mV for the NMOS FETs and about 2.25 mV for the PMOS FETs; for the process corner SS, the Vmin is about 0.1 mV for the NMOS FETs and about 2.13 mV for the PMOS FETs; for the process corner FF, the Vmin is about 0.15 mV for the PMOS FETs and 2.4 mV for the NMOS FETs; for the process corner SF, the Vmin is about 0.1 mV for the NMOS FETs and 2.4 mV for the PMOS FETs; and for the process corner FS, the Vmin is about 0.1 mV for the NMOS FETs and 2.3 mV for the PMOS FETs.

Similarly, the bar chart shows that by including the diode-connected PMOS in the stages of the RO 1500, the sensitivity to the PMOS process performance is significantly improved over the sensitivity to the PMOS process of the RO 300. Further, the NBTI/PBTI separation is much higher with diode-connected FET RO 1500 compared to all input-connected gate FET RO 300. For example, from a two-to-one NBTI/PBTI separation with the all input-connected gate FET RO 300 to 10-to-one NBTI/PBTI separation for the diode-connected RO 1500.

Figure 18:
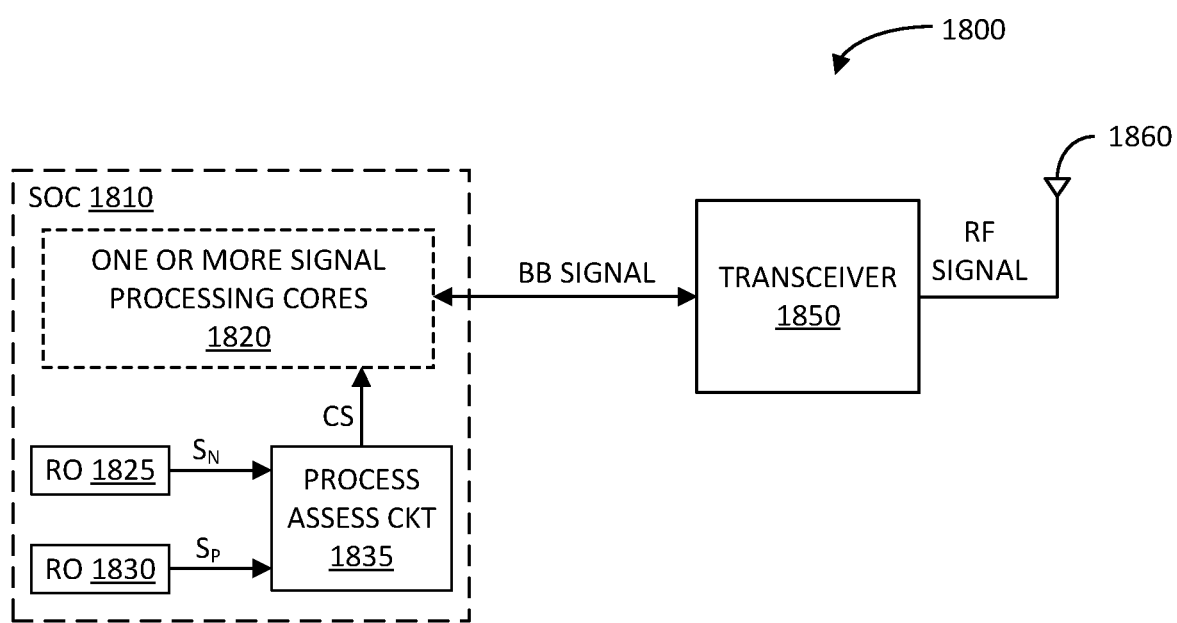
FIG. 18 illustrates a block diagram of an example wireless communication device in accordance with another aspect of the disclosure.

FIG. 18 illustrates a block diagram of an example wireless communication device 1800 in accordance with another aspect of the disclosure. The wireless communication device 1800 may be a smart phone, a desktop computer, laptop computer, tablet device, Internet of Things (IoT), wearable wireless device (e.g., wireless watch), and other types of wireless device.

In particular, the wireless communication device 1800 includes an integrated circuit (IC), which may be implemented as a system on chip (SOC) 1810. The SOC 1810 includes one or more signal processing cores 1820, a first ring oscillator (RO) 1825, a second RO 1830, and a process assessment circuit 1835. The first RO 1825 is configured to generate a signal $S_N$ whose frequency $f_N$ is related to process performance (e.g., skew) of NFETs implemented in the first RO 1825 as well as other NFETs in the SOC 1810. The first RO 1825 may be implemented per any one of the ROs 800 and 1400 previously discussed. Similarly, the second RO 1830 is configured to generate a signal $S_P$ whose frequency $f_P$ is related to process performance (e.g., skew) of PFETs implemented in the second RO 1830 as well as other PFETs in the SOC 1810. The second RO 1830 may be implemented per any one of the ROs 900 and 1500 previously discussed.

The process assessment circuit 1835 is configured to receive the signals $S_N$ and $S_P$ from the first and second ROs 1825 and 1830, respectively. The process assessment circuit 1835 may determine a process corner (e.g., SS, FF, FS, or SF) for the SOC 1810, and generate a control signal (CS) based on the aforementioned determination. The one or more signal processing cores 1820 may be configured to generate a transmit baseband (BB) signal and process a received baseband (BB) signal based on one or more clock signals (e.g., a periodic signal that drives sequential circuits). The one or more signal processing cores 1820 receives the control signal (CS) from the process assessment circuit 1835, and may control various operations based on the control signal (CS), such as adjusts the frequency of the one or more clock signals, perform duty cycle distortion (DCD) compensation on the one or more clock signals, and/or other operations.

The wireless communication device 1800 may further include a transceiver 1850 and at least one antenna 1860 (e.g., an antenna array). The transceiver 1850 is coupled to the one or more signal processing cores 1820 to receive therefrom the transmit BB signal and provide thereto the received BB signal. The transceiver 1850 is configured to convert the transmit BB signal into a transmit radio frequency (RF) signal, and convert a received RF signal into the received BB signal. The transceiver 1850 is coupled to the at least one antenna 1860 to provide thereto the transmit RF signal for electromagnetic radiation into a wireless medium for wireless transmission, and receive the received RF signal electromagnetically picked up from the wireless medium by the at least one antenna 1860.

The following provides an overview of aspects of the present disclosure:

Aspect 1: An integrated circuit (IC), comprising: a first ring oscillator (RO) comprising a first set of cascaded stages, wherein each of the first set of cascaded stages comprises a first logic inverter, comprising: a first set of field effect transistors (FETs) coupled in parallel between a first voltage rail and a first intermediate node, wherein the first set of FETs include a set of gates coupled to an input of the first logic inverter; and a second set of FETs coupled in series between the first intermediate node and a second voltage rail, wherein the second set of FETs includes at least a first FET including a gate coupled to the input of the first logic inverter, and at least a second FET that is diode-connected in accordance with a first mode of operation Aspect 2: The IC of aspect 1, wherein the first set of FETs comprises a set of p-channel metal oxide semiconductor field effect transistors (PMOS FETs), and wherein the second set of FETs comprises a set of n-channel metal oxide semiconductor field effect transistors (NMOS FETs).

Aspect 3: The IC of aspect 2, wherein the set of PMOS FETs include: respective sources coupled to the first voltage rail, respective gates coupled to the input of the first logic inverter, and respective drains coupled to the first intermediate node.

Aspect 4: The IC of aspect 2 or 3, wherein: the at least first FET comprises a first NMOS FET including a first drain coupled to the first intermediate node, a first gate coupled to the input of the first logic inverter, and a first source; the at least first FET further comprises a second NMOS FET including a second drain coupled to the first source, a second gate coupled to the input of the first logic inverter; and a second source; and the at least second FET comprises a third NMOS FET coupled between the second NMOS FET and the second voltage rail.

Aspect 5: The IC of aspect 1, wherein the first set of FETs comprises a set of n-channel metal oxide semiconductor field effect transistors (NMOS FETs), and wherein the second set of FETs comprises a set of p-channel metal oxide semiconductor field effect transistors (PMOS FETs).

Aspect 6: The IC of aspect 5, wherein the set of NMOS FETs include: respective sources coupled to the first voltage rail, respective gates coupled to the input of the first logic inverter, and respective drains coupled to the first intermediate node.

Aspect 7: The IC of aspect 5 or 6, wherein: the at least first FET comprises a first PMOS FET including a first drain coupled to the first intermediate node, a first gate coupled to the input of the first logic inverter, and a first source; the at least first FET further comprises a second PMOS FET including a second drain coupled to the first source, a second gate coupled to the input of the first logic inverter; and a second source; and the at least second FET comprises a third PMOS FET coupled between the second PMOS FET and the second voltage rail.

Aspect 8: The IC of any one of aspects 1-7, wherein the at least second FET is not diode-connected in accordance with a second mode of operation.

Aspect 9: The IC of claim 8, further comprising: a first switching device coupled between the input of the first logic inverter and a gate of the at least second FET, wherein the first switching device is responsive to a mode signal indicative of the first or second mode of operation; and a second switching device coupled between a drain of the at least second FET and the gate of the at least second FET, wherein the second switching device is responsive to the mode signal; wherein the first switching device is turned off and the second switching device is turned on in response to the mode signal indicating the first mode of operation, and wherein the first switching device is turned on and the second switching device is turned off in response to the mode signal indicating the second mode of operation.

Aspect 10: The IC of aspect 9, wherein the first and second switching devices comprise transmission gates, respectively.

Aspect 11: The IC of any one of aspects 1-10, wherein each of the first set of cascaded stages comprises a second logic inverter.

Aspect 12: The IC of aspect 11, wherein the second logic inverter comprises: a third set of field effect transistors (FETs) coupled in parallel between the first voltage rail and an output of the second logic inverter, wherein the third set of FETs include a set of gates coupled to the first intermediate node; and a fourth set of FETs coupled in series between the output and the second voltage rail, wherein the fourth set of FETs includes a set of gates coupled to the first intermediate node.

Aspect 13: The IC of aspect 12, wherein the first and third sets of FETs comprises a set of p-channel metal oxide semiconductor field effect transistors (PMOS FETs), and wherein the second and fourth sets of FETs comprises a set of n-channel metal oxide semiconductor field effect transistors (NMOS FETs).

Aspect 14: The IC of aspect 12, wherein the first and third sets of FETs comprises a set of n-channel metal oxide semiconductor field effect transistors (NMOS FETs), and wherein the second and fourth sets of FETs comprises a set of p-channel metal oxide semiconductor field effect transistors (PMOS FETs).

Aspect 15: The IC of any one of aspects 1-14, wherein the first RO further comprise a selectively-enabled inverter coupled between two of the first set of cascaded stages.

Aspect 16: The IC of aspect 15, wherein the selectively-enabled inverter comprises a NAND gate including a first input coupled to an output of one of the two cascaded stages, a second input configured to receive an enable signal, and an output coupled to an input of the other of the two cascaded stages.

Aspect 17: The IC of aspect 15, wherein the selectively-enabled inverter comprises a NOR gate including a first input coupled to an output of one of the two cascaded stages, a second input configured to receive an enable signal, and an output coupled to an input of the other of the two cascaded stages.

Aspect 18: The IC of any one of aspects 1-17, further comprising a second ring oscillator (RO) comprising a second set of cascaded stages, wherein each of the second set of cascaded stages comprises a second logic inverter, comprising: a third set of field effect transistors (FETs) coupled in parallel between the first voltage rail and a second intermediate node, wherein the third set of FETs include a set of gates coupled to an input of the second logic inverter; and a fourth set of FETs coupled in series between the second intermediate node and the second voltage rail, wherein the fourth set of FETs includes at least a third FET including a gate coupled to the input of the second logic inverter, and at least a fourth FET that is diode-connected in accordance with the first mode of operation.

Aspect 19: The IC of aspect 18, wherein the first and fourth sets of FETs comprises a set of p-channel metal oxide semiconductor field effect transistors (PMOS FETs), and wherein the second and third sets of FETs comprises a set of n-channel metal oxide semiconductor field effect transistors (NMOS FETs).

Aspect 20: The IC of aspect 19, further comprising a process assessment circuit coupled to the first and second ROs.

Aspect 21: The IC of aspect 20, wherein: the first RO is configured to generate a first oscillating signal with a first frequency; the second RO is configured to generate a second oscillating signal cycling with a second frequency; and the process assessment circuit is configured to determine a process corner associated with the first, second, third, and fourth sets of FETs based on the first and second frequencies.

Aspect 22: The IC of aspect 20 or 21, wherein: the first RO is configured to generate a first oscillating signal with a first frequency; the second RO is configured to generate a second oscillating signal cycling with a second frequency; and the process assessment circuit is configured to perform one or more operations based on the first and second frequencies.

Aspect 23: A logic inverter, comprising: a first set of field effect transistors (FETs) coupled in parallel between a first voltage rail and an output, wherein the first set of FETs include a set of gates coupled to an input, respectively; and a second set of FETs coupled in series between the output and a second voltage rail, wherein the second set of FETs includes at least a first FET including a gate coupled to the input, and at least a second FET that is diode-connected in accordance with a first mode of operation.

Aspect 24: The logic inverter of aspect 23, wherein the first set of FETs comprises a set of p-channel metal oxide semiconductor field effect transistors (PMOS FETs), and wherein the second set of FETs comprises a set of n-channel metal oxide semiconductor field effect transistors (NMOS FETs).

Aspect 25: The logic inverter of aspect 23, wherein the first set of FETs comprises a set of n-channel metal oxide semiconductor field effect transistors (NMOS FETs), and wherein the second set of FETs comprises a set of p-channel metal oxide semiconductor field effect transistors (PMOS FETs).

Aspect 26: The logic inverter of any one of aspects 23-25, wherein the at least second FET is not diode-connected in accordance with a second mode of operation.

Aspect 27: The logic inverter of aspect 26, further comprising: a first switching device coupled between the input of the first logic inverter and a gate of the at least second FET, wherein the first switching device is responsive to a mode signal indicative of the first or second mode of operation; and a second switching device coupled between a drain of the at least second FET and the gate of the at least second FET, wherein the second switching device is responsive to the mode signal; wherein the first switching device is turned off and the second switching device is turned on in response to the mode signal indicating the first mode of operation, and wherein the first switching device is turned on and the second switching device is turned off in response to the mode signal indicating the second mode of operation.

Aspect 28: A wireless communication device comprising: at least one antenna; a transceiver coupled to the at least one antenna; one or more signal processing cores coupled to the transceiver; and a ring oscillator (RO) coupled to the one or more signal processing cores, wherein the RO comprises a set of cascaded stages, wherein each of the set of cascaded stages comprises a first logic inverter, including: a first set of field effect transistors (FETs) coupled in parallel between a first voltage rail and a first intermediate node, wherein the first set of FETs include a set of gates coupled to an input of the first logic inverter; and a second set of FETs coupled in series between the first intermediate node and a second voltage rail, wherein the second set of FETs includes at least a first FET including a gate coupled to the input of the first logic inverter, and at least a second FET that is diode-connected in accordance with a first mode of operation.

Aspect 29: The wireless communication device of aspect 28, wherein the first set of FETs comprises a set of p-channel metal oxide semiconductor field effect transistors (PMOS FETs), and wherein the second set of FETs comprises a set of n-channel metal oxide semiconductor field effect transistors (NMOS FETs).

Aspect 30: The wireless communication device of aspect 28, wherein the first set of FETs comprises a set of n-channel metal oxide semiconductor field effect transistors (NMOS FETs), and wherein the second set of FETs comprises a set of p-channel metal oxide semiconductor field effect transistors (PMOS FETs).

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An integrated circuit (IC), comprising:
a first ring oscillator (RO) comprising a first set of cascaded stages, wherein each of the first set of cascaded stages comprises a first logic inverter, comprising:
a first set of field effect transistors (FETs) coupled in parallel between a first voltage rail and a first intermediate node, wherein the first set of FETs include a set of gates coupled to an input of the first logic inverter; and
a second set of FETs coupled in series between the first intermediate node and a second voltage rail, wherein the second set of FETs includes at least a first FET including a gate coupled to the input of the first logic inverter, and at least a second FET that is diode-connected in accordance with a first mode of operation, wherein the at least second FET is not diode-connected in accordance with a second mode of operation.

2. The IC of claim 1, wherein the first set of FETs comprises a set of p-channel metal oxide semiconductor field effect transistors (PMOS FETs), and wherein the second set of FETs comprises a set of n-channel metal oxide semiconductor field effect transistors (NMOS FETs).

3. The IC of claim 2, wherein the set of PMOS FETs include: respective sources coupled to the first voltage rail, respective gates coupled to the input of the first logic inverter, and respective drains coupled to the first intermediate node.

4. The IC of claim 2, wherein:
the at least first FET comprises a first NMOS FET including a first drain coupled to the first intermediate node, a first gate coupled to the input of the first logic inverter, and a first source;
the at least first FET further comprises a second NMOS FET including a second drain coupled to the first source, a second gate coupled to the input of the first logic inverter; and a second source; and
the at least second FET comprises a third NMOS FET coupled between the second NMOS FET and the second voltage rail.

5. The IC of claim 1, wherein the first set of FETs comprises a set of n-channel metal oxide semiconductor field effect transistors (NMOS FETs), and wherein the second set of FETs comprises a set of p-channel metal oxide semiconductor field effect transistors (PMOS FETs).

6. The IC of claim 5, wherein the set of NMOS FETs include:
respective sources coupled to the first voltage rail, respective gates coupled to the input of the first logic inverter, and respective drains coupled to the first intermediate node.

7. The IC of claim 5, wherein:
the at least first FET comprises a first PMOS FET including a first drain coupled to the first intermediate node, a first gate coupled to the input of the first logic inverter, and a first source;
the at least first FET further comprises a second PMOS FET including a second drain coupled to the first source, a second gate coupled to the input of the first logic inverter; and a second source; and
the at least second FET comprises a third PMOS FET coupled between the second PMOS FET and the second voltage rail.

8. The IC of claim 1, further comprising:
a first switching device coupled between the input of the first logic inverter and a gate of the at least second FET, wherein the first switching device is responsive to a mode signal indicative of the first or second mode of operation; and
a second switching device coupled between a drain of the at least second FET and the gate of the at least second FET, wherein the second switching device is responsive to the mode signal;
wherein the first switching device is turned off and the second switching device is turned on in response to the mode signal indicating the first mode of operation, and wherein the first switching device is turned on and the second switching device is turned off in response to the mode signal indicating the second mode of operation.

9. The IC of claim 8, wherein the first and second switching devices comprise transmission gates, respectively.

10. The IC of claim 1, wherein each of the first set of cascaded stages comprises a second logic inverter.

11. The IC of claim 10, wherein the second logic inverter comprises:
a third set of field effect transistors (FETs) coupled in parallel between the first voltage rail and an output of the second logic inverter, wherein the third set of FETs include a set of gates coupled to the first intermediate node; and
a fourth set of FETs coupled in series between the output and the second voltage rail, wherein the fourth set of FETs includes a set of gates coupled to the first intermediate node.

12. The IC of claim 11, wherein the first and third sets of FETs comprises a set of p-channel metal oxide semiconductor field effect transistors (PMOS FETs), and wherein the second and fourth sets of FETs comprises a set of n-channel metal oxide semiconductor field effect transistors (NMOS FETs).

13. The IC of claim 11, wherein the first and third sets of FETs comprises a set of n-channel metal oxide semiconductor field effect transistors (NMOS FETs), and wherein the second and fourth sets of FETs comprises a set of p-channel metal oxide semiconductor field effect transistors (PMOS FETs).

14. The IC of claim 1, wherein the first RO further comprise a selectively-enabled inverter coupled between two of the first set of cascaded stages.

15. The IC of claim 14, wherein the selectively-enabled inverter comprises a NAND gate including a first input coupled to an output of one of the two cascaded stages, a second input configured to receive an enable signal, and an output coupled to an input of the other of the two cascaded stages.

16. The IC of claim 14, wherein the selectively-enabled inverter comprises a NOR gate including a first input coupled to an output of one of the two cascaded stages, a second input configured to receive an enable signal, and an output coupled to an input of the other of the two cascaded stages.

17. The IC of claim 1, further comprising a second ring oscillator (RO) comprising a second set of cascaded stages, wherein each of the second set of cascaded stages comprises a second logic inverter, comprising:
a third set of field effect transistors (FETs) coupled in parallel between the first voltage rail and a second intermediate node, wherein the third set of FETs include a set of gates coupled to an input of the second logic inverter; and a fourth set of FETs coupled in series between the second intermediate node and the second voltage rail, wherein the fourth set of FETs includes at least a third FET including a gate coupled to the input of the second logic inverter, and at least a fourth FET that is diode-connected in accordance with the first mode of operation.

18. The IC of claim 17, wherein the first and fourth sets of FETs comprises a set of p-channel metal oxide semiconductor field effect transistors (PMOS FETs), and wherein the second and third sets of FETs comprises a set of n-channel metal oxide semiconductor field effect transistors (NMOS FETs).

19. The IC of claim 18, further comprising a process assessment circuit coupled to the first and second ROs.

20. The IC of claim 19, wherein:
the first RO is configured to generate a first oscillating signal with a first frequency;
the second RO is configured to generate a second oscillating signal cycling with a second frequency; and
the process assessment circuit is configured to determine a process corner associated with the first, second, third, and fourth sets of FETs based on the first and second frequencies.

21. The IC of claim 19, wherein:
the first RO is configured to generate a first oscillating signal with a first frequency;
the second RO is configured to generate a second oscillating signal cycling with a second frequency; and
the process assessment circuit is configured to perform one or more operations based on the first and second frequencies.

22. A logic inverter, comprising:
a first set of field effect transistors (FETs) coupled in parallel between a first voltage rail and an output, wherein the first set of FETs include a set of gates coupled to an input, respectively; and
a second set of FETs coupled in series between the output and a second voltage rail, wherein the second set of FETs includes at least a first FET including a gate coupled to the input, and at least a second FET that is diode-connected in accordance with a first mode of operation, wherein the at least second FET is not diode-connected in accordance with a second mode of operation.

23. The logic inverter of claim 22, wherein the first set of FETs comprises a set of p-channel metal oxide semiconductor field effect transistors (PMOS FETs), and wherein the second set of FETs comprises a set of n-channel metal oxide semiconductor field effect transistors (NMOS FETs).

24. The logic inverter of claim 22, wherein the first set of FETs comprises a set of n-channel metal oxide semiconductor field effect transistors (NMOS FETs), and wherein the second set of FETs comprises a set of p-channel metal oxide semiconductor field effect transistors (PMOS FETs).

25. The logic inverter of claim 22, further comprising:
a first switching device coupled between the input of the first logic inverter and a gate of the at least second FET, wherein the first switching device is responsive to a mode signal indicative of the first or second mode of operation; and
a second switching device coupled between a drain of the at least second FET and the gate of the at least second FET, wherein the second switching device is responsive to the mode signal;
wherein the first switching device is turned off and the second switching device is turned on in response to the mode signal indicating the first mode of operation, and wherein the first switching device is turned on and the second switching device is turned off in response to the mode signal indicating the second mode of operation.

26. A wireless communication device, comprising:
at least one antenna;
a transceiver coupled to the at least one antenna;
one or more signal processing cores coupled to the transceiver; and
a ring oscillator (RO) coupled to the one or more signal processing cores, wherein the RO comprises a set of cascaded stages, wherein each of the set of cascaded stages comprises a first logic inverter, comprising:
a first set of field effect transistors (FETs) coupled in parallel between a first voltage rail and a first intermediate node, wherein the first set of FETs include a set of gates coupled to an input of the first logic inverter; and
a second set of FETs coupled in series between the first intermediate node and a second voltage rail, wherein the second set of FETs includes at least a first FET including a gate coupled to the input of the first logic inverter, and at least a second FET that is diode-connected in accordance with a first mode of operation, wherein the at least second FET is not diode-connected in accordance with a second mode of operation.

27. The wireless communication device of claim 26, wherein the first set of FETs comprises a set of p-channel metal oxide semiconductor field effect transistors (PMOS FETs), and wherein the second set of FETs comprises a set of n-channel metal oxide semiconductor field effect transistors (NMOS FETs).

28. The wireless communication device of claim 26, wherein the first set of FETs comprises a set of n-channel metal oxide semiconductor field effect transistors (NMOS FETs), and wherein the second set of FETs comprises a set of p-channel metal oxide semiconductor field effect transistors (PMOS FETs).

* * * * *